United States Patent
Wu et al.

(10) Patent No.: US 11,621,380 B2
(45) Date of Patent: Apr. 4, 2023

(54) FLIP-CHIP OF LIGHT EMITTING DIODE AND MANUFACTURING METHOD AND ILLUMINATING METHOD THEREOF

(71) Applicant: XIAMEN CHANGELIGHT CO., LTD., Fujian (CN)

(72) Inventors: Xingen Wu, Xiamen (CN); Yingce Liu, Xiamen (CN); Junxian Li, Xiamen (CN); Qilong Wu, Xiamen (CN)

(73) Assignee: Xiamen Changelight Co., Ltd., Fujian (CN)

( * ) Notice: Subject to any disclaimer, the term of this patent is extended or adjusted under 35 U.S.C. 154(b) by 276 days.

(21) Appl. No.: 16/626,517

(22) PCT Filed: Jul. 31, 2018

(86) PCT No.: PCT/CN2018/097778
§ 371 (c)(1),
(2) Date: Apr. 1, 2020

(87) PCT Pub. No.: WO2019/205328
PCT Pub. Date: Oct. 31, 2019

(65) Prior Publication Data
US 2020/0251632 A1    Aug. 6, 2020

(30) Foreign Application Priority Data

Apr. 26, 2018  (CN) .......................... 201810382603.0
Apr. 26, 2018  (CN) .......................... 201820604683.5

(51) Int. Cl.
*H01L 33/60*    (2010.01)
*H01L 27/15*    (2006.01)
(Continued)

(52) U.S. Cl.
CPC ............ *H01L 33/60* (2013.01); *H01L 27/153* (2013.01); *H01L 33/36* (2013.01); *H01L 33/62* (2013.01)

(58) Field of Classification Search
CPC ......... H01L 33/36; H01L 33/60; H01L 33/62; H01L 25/0753; H01L 25/167; H01L 33/12; H01L 33/405; G02F 1/133612
See application file for complete search history.

(56) References Cited

U.S. PATENT DOCUMENTS

| | | |
|---|---|---|
| 2014/0361327 A1 | 12/2014 | Chae et al. |
| 2015/0200334 A1 | 7/2015 | Chae et al. |
| | (Continued) | |

FOREIGN PATENT DOCUMENTS

| | | |
|---|---|---|
| CN | 103828073 A | 5/2014 |
| CN | 104681704 A | 6/2015 |
| | (Continued) | |

OTHER PUBLICATIONS

International Search Report of International Application No. PCT/CN2018/097778 dated Jan. 24, 2019 with English translation, (4p).

*Primary Examiner* — Latanya N Crawford Eason
(74) *Attorney, Agent, or Firm* — Arch & Lake LLP

(57) ABSTRACT

A flip-chip of light emitting diode includes at least one reflective layer, at least one N-type electrode, at least one P-type electrode, at least one distributed Bragg reflector, and an epitaxial unit. The epitaxial unit includes a substrate, an N-type layer, an active layer, and a P-type layer, wherein the substrate, the N-type layer, the active layer, and the P-type are sequentially stacked. The epitaxial unit has at least one N-type layer exposed portion, which is extended from the outer side surface of the P-type layer to the N-type layer via the active layer. The at least one reflective layer is formed on the P-type layer, wherein the at least one distributed Bragg reflector is integrally bonded to the N-type layer, the active (Continued)

layer, the P-type layer, and the at least one reflective layer. The at least one N-type electrode is electrically connected with the N-type layer and the at least one P-type electrode is electrically connected with the P-type layer.

16 Claims, 5 Drawing Sheets

(51) Int. Cl.
    *H01L 33/36*     (2010.01)
    *H01L 33/62*     (2010.01)

(56) References Cited

U.S. PATENT DOCUMENTS

2016/0043282 A1     2/2016   Chae et al.
2016/0233386 A1     8/2016   Chae et al.
2016/0343911 A1   11/2016   Chae et al.

FOREIGN PATENT DOCUMENTS

CN     105609612 A   *   5/2016
CN     105609612 A       5/2016

* cited by examiner

FLIP-CHIP OF LIGHT EMITTING DIODE AND MANUFACTURING METHOD AND ILLUMINATING METHOD THEREOF

CROSS REFERENCE OF RELATED APPLICATION

This is a U.S. National Stage under 35 U.S.C. 371 of the International Application Number PCT/CN2018/097778, filed Jul. 31, 2018, which claims priority to Chinese application number CN201810382603.0, filed Apr. 26, 2018 and Chinese application number CN201820604683.5, filed Apr. 26, 2018.

BACKGROUND OF THE PRESENT INVENTION

Field of Invention

The present invention relates to LED chip, and more particularly to a flip-chip of light emitting diode and manufacturing method and illuminating method thereof.

Description of Related Arts

Since Light Emitting Diode (LED) has low power consumption, small size and high reliability, in recent years, light emitting diodes have been widely used in daily lighting, vehicle lighting, indication, display, and etc. According to the manufacturing process of semiconductor chip, the light emitting diode structure can be divided into up-mounted-chip LED and flip-chip LED. In addition, since the flip-chip LEDs have characteristics of electrodeless light blocking, low thermal resistance and high withstand current impact, the flip-chip LEDs have become an important research direction for high-power LEDs.

Different from the up-mounted-chip LED, the light emitting surface of the flip-chip LEDs is on the substrate (such as a sapphire surface), which determines that the process of manufacturing light emitting surface on the electrode side of the flip-chip LED becomes an important step that affects the illumination quality of the flip-chip LED. Because metallic silver is a highly reflective metal material, the current popular flip-chip LED in the market utilizes high-reflection metallic silver as a silver mirror to achieve light reflection. However, it is well known that metal silver is a kind of active metal. With certain humidity, the silver mirror formed by the metal silver on the electrode side of the flip-chip LED is easy to migration, and that once the silver mirror has an adverse migration phenomenon, it is bound to affect the light emitting quality of the light emitting diode. Therefore, it is necessary to design an anti-diffusion layer on the silver mirror to ensure the stability of the silver mirror, and the size of the at least one anti-diffusion layer must be larger than the size of the silver mirror, so that the at least one anti-diffusion layer can be fully covering the silver mirror. Due to the metallic limitation of the silver material itself, the silver mirror can only be disposed on the surface of the P-type gallium nitride, and cannot be disposed between the at least one N-type electrode and the PN, which limits the luminance of the flip-chip LED.

SUMMARY OF THE PRESENT INVENTION

The invention is advantageous in that it provides a flip-chip of light emitting diode and manufacturing method and illuminating method thereof, wherein luminance of the light emitting diode can be greatly improved.

Another advantage of the invention is to provide a flip-chip of light emitting diode and manufacturing method and illuminating method thereof, wherein the area of the reflective surface of the flip-chip can be increased, so as to enhance the luminance of the light emitting diode.

Another advantage of the invention is to provide a flip-chip of light emitting diode and manufacturing method and illuminating method thereof, wherein the reflectance of a non-covered area of a P-type layer of the flip-chip by the at least one reflective layer can be improved, so as to enhance the luminance of the light emitting diode.

Another advantage of the invention is to provide a flip-chip of light emitting diode and manufacturing method and illuminating method thereof, wherein the flip-chip provides one or more distributed Bragg reflector, wherein the at least one distributed Bragg reflector is formed on the P-type layer to improve the reflectance of a non-covered area of a P-type layer of the flip-chip by the at least one reflective layer, so as to enhance the luminance of the light emitting diode.

Another advantage of the invention is to provide a flip-chip of light emitting diode and manufacturing method and illuminating method thereof, wherein the at least one distributed Bragg reflector has an insulating function to isolate the P-type layer and the N-type layer, so as to ensure the reliability of the flip-chip.

Another advantage of the invention is to provide a flip-chip of light emitting diode and manufacturing method and illuminating method thereof, wherein the at least one distributed Bragg reflector has an insulating function to isolate the P-type layer and the at least one N current spreading layer, so as to ensure the reliability of the flip-chip.

Another advantage of the invention is to provide a flip-chip of light emitting diode and manufacturing method and illuminating method thereof, wherein the at least one distributed Bragg reflector has an insulating function to isolate the at least one N current spreading layer and the at least one P current spreading layer, so as to ensure the reliability of the flip-chip.

Additional advantages and features of the invention will become apparent from the description which follows, and can be realized by means of the instrumentalities and combinations particular point out in the appended claims.

According to the present invention, the foregoing and other objects and advantages are attained by a flip-chip of light emitting diode, comprising:
  at least one reflective layer;
  at least one N-type electrode;
  at least one P-type electrode;
  at least one distributed Bragg reflector; and
  an epitaxial unit, wherein the epitaxial unit comprises a substrate, an N-type layer, an active layer, and a P-type layer, wherein the substrate, the N-type layer, the active layer, and the P-type are sequentially stacked, and the epitaxial unit has at least one N-type layer exposed portion, wherein the at least one N-type layer exposed portion is extended from an outer side surface of the P-type layer to the N-type layer via the active layer, wherein the at least one reflective layer is formed on the P-type layer, wherein the at least one distributed Bragg reflector is integrally bonded to the N-type layer, the active layer, the P-type layer, and the at least one reflective layer, wherein the at least one N-type electrode is electrically connected with the N-type layer and the at least one P-type electrode is electrically connected with the P-type layer.

According to one embodiment of the present invention, the flip-chip further comprises an anti-diffusion layer, wherein the at least one anti-diffusion layer is formed on the P-type layer and covers at least a portion of the at least one reflective layer, wherein the at least one distributed Bragg reflector is integrally combined with the at least one anti-diffusion layer.

According to one embodiment of the present invention, the at least one reflective layer is a silver reflective layer, wherein the at least one reflective layer is fully covered by the at least one anti-diffusion layer.

According to one embodiment of the present invention, the at least one anti-diffusion layer is electrically connected with the P-type layer, wherein the at least one P-type electrode is electrically connected with the P-type layer in such a manner that the at least one P-type electrode is electrically connected with the at least one anti-diffusion layer.

According to one embodiment of the present invention, the flip-chip further comprises at least one N current spreading layer, wherein the at least one N current spreading layer is electrically connected with the N-type layer in such a manner that the at least one N current spreading layer is remained on the at least one N-type layer exposed portion, wherein the at least one N-type electrode is electrically connected with the N-type layer in such a manner that the at least one N-type electrode is electrically connected with the at least one N current spreading layer, wherein the at least one distributed Bragg reflector is integrally combined with the at least one N current spreading layer.

According to one embodiment of the present invention, the at least one distributed Bragg reflector has one or more N-type layer channels and one or more P-type layer channels, wherein the at least one N current spreading layer is corresponded to the one or more N-type layer channels, wherein the at least one N-type electrode is formed on the at least one distributed Bragg reflector, and the at least one N-type electrode is extended to the at least one N current spreading layer via the one or more N-type layer channels, wherein the at least one anti-diffusion layer is corresponded to the one or more P-type layer channels, wherein the at least one P-type electrode is formed on the at least one distributed Bragg reflector and the at least one P-type electrode is extended to the at least one anti-diffusion layer via the one or more P-type layer channels.

According to one embodiment of the present invention, the at least one N current spreading layer is extended from the N-type layer toward the P-type layer, and a height of an outer side surface of the at least one N current spreading layer is lower than a height of an outer side surface of the P-type layer.

According to one embodiment of the present invention, the flip-chip further comprises at least one N current spreading layer and at least one P current spreading layer, wherein the at least one distributed Bragg reflector has one or more N-type layer channels and one or more P-type layer channels, wherein the N-type layer is formed corresponding to the one or more N-type layer channels, wherein the at least one N current spreading layer is formed in the at least one distributed Bragg reflector, and the at least one N current spreading layer is extended through the one or more N-type layer channels to the N-type layer, and the at least one N current spreading layer is electrically connected with the N-type layer, wherein the at least one N-type electrode is electrically connected with the N-type layer in such a manner that the at least one N-type electrode is electrically connected with the at least one N-current spreading layer, wherein the P-type layer is formed corresponding to the one or more P-type layer channels, wherein the at least one P current spreading layer is formed on the at least one distributed Bragg reflector, wherein the at least one P current spreading layer is extended via the one or more P-type layer channels to the P-type layer, and the at least one P current spreading layer is electrically connected with the P-type layer, wherein the at least one P-type electrode is electrically connected with the P-type layer in such a manner that the at least one P-type electrode is electrically connected with the at least one P current spreading layer.

According to one embodiment of the present invention, the flip-chip further comprises at least one insulating layer, wherein the at least one insulating layer has one or more first channels and one or more second channels, wherein the at least one insulating layer is formed on the at least one N current spreading layer and the at least one P current spreading layer, and the one or more first channels are formed corresponding to the at least one N current spreading layer, and the one or more second channels are formed corresponding to the at least one P current spreading layer, wherein the at least one N-type electrode is electrically connected with the at least one N current spreading layer through the one or more first channels of the at least one insulating layer, wherein the at least one P-type electrode is electrically connected with the at least one P current spreading layer through the one or more second channels of the at least one insulating layer.

According to one embodiment of the present invention, the at least one insulating layer is combined with the at least one distributed Bragg reflector, so as to isolate the at least one N current spreading layer and the at least one P current spreading layer by the at least one insulating layer.

According to one embodiment of the present invention, the at least one N-type electrode is formed on the at least one insulating layer, and the at least one N-type electrode is extended to the at least one N current spreading layer via the one or more first channels of the at least one insulating layer, wherein the at least one P-type electrode is formed on the at least one insulating layer, and the at least one P-type electrode is extended to the at least one P current spreading layer via the one or more second channels of the at least one insulating layer.

According to one embodiment of the present invention, the at least one distributed Bragg reflector is formed by a stack of at least two refractive index film layers.

According to one embodiment of the present invention, the material of the film layer of the at least one distributed Bragg reflector is selected from the group consisting of silicon oxide, titanium oxide, magnesium fluoride, cerium oxide, aluminum oxide, and aluminum nitride.

According to one embodiment of the present invention, the material of the at least one anti-diffusion layer is selected from the group consisting of titanium tungsten, titanium, platinum, aluminum, nickel, and gold.

According to one embodiment of the present invention, the material of the at least one N current spreading layer is selected from the group consisting of chromium, aluminum, titanium, platinum, gold, and nickel.

According to one embodiment of the present invention, the material of the at least one P current spreading layer is selected from the group consisting of chromium, aluminum, titanium, platinum, gold, and nickel.

According to one embodiment of the present invention, the electrode material of the at least one N-type electrode and the at least one P-type electrode are selected from the group consisting of chromium, aluminum, titanium, platinum, gold, nickel, and gold tin.

According to one embodiment of the present invention, the N-type layer is an N-type gallium nitride layer and the P-type layer is a P-type gallium nitride layer.

According to one embodiment of the present invention, the material of the at least one insulating layer is selected from the group consisting of silicon oxide, silicon nitride, silicon oxynitride, aluminum oxide, and aluminum nitride.

According to one embodiment of the present invention, the structure of the at least one reflective layer is a stacked structure of silver and titanium tungsten.

According to one embodiment of the present invention, the silver layer of the at least one reflective layer has a thickness ranging from 100 angstroms to 5000 angstroms, wherein the titanium tungsten layer of the at least one reflective layer has a thickness ranging from 200 angstroms to 5000 angstroms.

According to one embodiment of the present invention, the at least one distributed Bragg reflector has a thickness ranging from 0 μm to 7 μm.

According to another aspect of the present invention, the present invention further provides a manufacturing method for a flip-chip of light emitting diode, wherein the manufacturing method comprises the following steps:

(a) forming at least one reflective layer on an outer side surface of a P-type layer of an epitaxial unit;

(b) covering an area of the outer side surface of the P-type layer that is not covered by the at least one reflective layer by at least one distributed Bragg reflector; and (c) electrically connecting at least one P-type electrode to the P-type layer, and electrically connecting at least one N-type electrode to an N-type layer of the epitaxial unit to produce the flip-chip.

According to one embodiment of the present invention, before the step (b), the method further comprises a step of:

forming at least one anti-diffusion layer on the outer side surface of the P-type layer, wherein the at least one reflective layer is covered by the at least one anti-diffusion layer, and the at least one anti-diffusion layer is electrically connected with the P-type layer, such that in the step (c), the at least one P-type electrode is electrically connected with the P-type layer in such a manner that the at least one P-type electrode is electrically connected with the at least one anti-diffusion layer.

According to one embodiment of the present invention, before the step (b), the method further comprises a step of:

forming at least one N current spreading layer on the N-type layer, wherein the at least one N current spreading layer is electrically connected with the N-type layer, such that in the step (c), the at least one N-type electrode is electrically connected with the N-type layer in such a manner that the at least one N-type electrode is electrically connected with the at least one N current spreading layer.

According to one embodiment of the present invention, in the step (b), in a manner that the at least one distributed Bragg reflector is integrally coupled to the P-type layer, the at least one anti-diffusion layer, and the at least one N current spreading layer, the at least one distributed Bragg reflector covers an area of the outer side of the P-type layer that is not covered by the at least one reflective layer, wherein the at least one distributed Bragg reflector has one or more N-type layer channel corresponding to the at least one N current spreading layer and one or more P-type layer channels corresponding to the at least one anti-diffusion layer, wherein the at least one N-type electrode is electrically connected with the at least one N current spreading layer via the one or more N-type layer channels, wherein the at least one P-type electrode is electrically connected with the at least one anti-diffusion layer via the one or more P-type layer channels.

According to one embodiment of the present invention, in the above method, the at least one N-type electrode is formed on the at least one distributed Bragg reflector, such that the at least one N-type electrode is extended to the N current extension via the one or more N-type layer channels, wherein the at least one P-type electrode is formed on the at least one distributed Bragg reflector, such that the at least one P-type electrode is extended to the at least one anti-diffusion layer via the one or more P-type layer channels.

According to one embodiment of the present invention, in the step (b), in a manner that the at least one distributed Bragg reflector is integrally formed on the P-type layer, the at least one anti-diffusion layer and the at least one N current spreading layer, the at least one distributed Bragg reflector covers an area of the outer side of the P-type layer that is not covered by the at least one reflective layer, wherein the at least one distributed Bragg reflector has one or more N-type layer channels corresponding to the N-type layer and one or more P-type layer channels corresponding to the P-type layer, wherein the at least one N-type electrode is electrically connected with the N-type layer via the one or more N-type layer channels, wherein the at least one P-type electrode is electrically connected with the P-type layer via the one or more P-type layer channels.

According to one embodiment of the present invention, in the above method, the method further comprises the steps of:

(i) forming at least one N current spreading layer on the at least one distributed Bragg reflector, wherein the at least one N current spreading layer is extended to the N-type layer via the one or more N-type layer channels, wherein the at least one N current spreading layer is electrically connected with the N-type layer, wherein the at least one N-type electrode is electrically connected with the at least one N current spreading layer; and (ii) forming one or more P current spreading layer on the at least one distributed Bragg reflector, wherein the at least one P current spreading layer is extended to the P-type layer via the one or more P-type layer channels, wherein the at least one P current spreading layer is electrically connected with the P-type layer, wherein the at least one P-type electrode is electrically connected with the at least one P current spreading layer.

According to one embodiment of the present invention, in the above method, the method further comprises a step of:

forming at least one insulating layer on the at least one N current spreading layer, the at least one P current spreading layer and the at least one distributed Bragg reflector, wherein the at least one insulating layer has one or more first channels corresponding to the at least one N current spreading layer and one or more second channels corresponding to the at least one P current spreading layer, wherein the at least one N-type electrode is electrically connected with the at least one N current spreading layer via the one or more first channels, wherein the at least one P-type electrode is electrically connected with the at least one P current spreading layer via the one or more second channels.

According to one embodiment of the present invention, in the above method, the at least one N-type electrode is formed on the at least one insulating layer, such that the at least one N-type electrode is extended to the at least one N current spreading layer via the one or more first channels, wherein the at least one P-type electrode is formed on the at least one insulating layer, such that the at least one P-type electrode is extended to the at least one P current spreading layer via the one or more second channels.

According to another aspect of the present invention, the present invention further provides an illuminating method of a flip-chip of light emitting diode, wherein the illuminating method comprises the steps of:

(A) applying an operating voltage to at least one N-type electrode and at least one P-type electrode of the flip-chip to cause at least one active layer of the flip-chip to generate light;

(B) allowing light generated by the active layer toward a substrate of the flip-chip to emit to the outside of the flip-chip after passing through the substrate;

(C) reflecting light from the active layer toward a P-type layer of the flip-chip by the at least one reflective layer, such that the reflected light passes through the substrate to radiate towards the outside of the flip-chip; and (D) reflecting light from the active layer toward the P-type layer by the at least one distributed Bragg reflector, such that the reflected light passes through the substrate to radiate towards the outside of the flip-chip.

According to one embodiment of the present invention, the at least one reflective layer covers a partial area of an outer side of the P-type layer, wherein the at least one distributed Bragg reflector covers another partial area of an outer side of the P-type layer, thereby in the step (C) and the step (D), both the at least one reflective layer and the at least one distributed Bragg reflector are capable of reflecting light generated by the active layer toward the P-type layer.

According to one embodiment of the present invention, the at least one distributed Bragg reflector is formed by a stack of film layers with at least two refractive indices.

According to one embodiment of the present invention, the film material of the at least one distributed Bragg reflector is selected from the group consisting of silicon oxide, titanium oxide, magnesium fluoride, cerium oxide, aluminum oxide, and aluminum nitride.

According to one embodiment of the present invention, the at least one distributed Bragg reflector has a thickness ranging from 0 μm to 7 μm.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
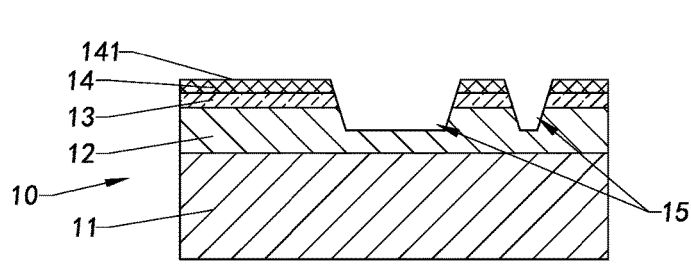
FIG. 1A is a sectional view illustrating the step one of a manufacturing method of a flip-chip of light emitting diode according to a preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

As shown in the drawings of the present invention, referring to FIGS. 1 to 6, a flip-chip of light emitting diode and manufacturing method and illuminating method thereof according to a preferred embodiment of the present invention is disclosed and illustrated. In the following description, the flip-chip of light emitting diode is simply referred as a flip-chip, but those person skilled in the art should understand that the flip-chip of the light emitting diode is simply referred as the flip-chip only for understanding the description of the present invention in more concise and understandable manner, but not for limiting the content and the scope of the invention. Specifically, the flip-chip comprises an epitaxial unit 10, at least one reflective layer 20, at least one anti-diffusion layer 30, at least one N current spreading layer 40, at least one distributed Bragg reflectors 50, and at least one N-type electrode 60, and at least one P-type electrode 70.

Figure 1B:
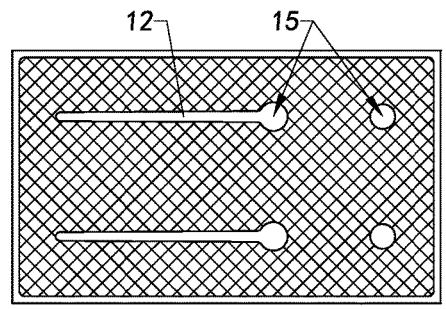
FIG. 1B is a top view illustrating the step one of the manufacturing method of the flip-chip according to the above preferred embodiment of the present invention.

As shown in FIGS. 1A and 1B, in the process of manufacturing the flip-chip, firstly, the epitaxial unit 10 is provided for subsequently forming the at least one reflective layer 20, the at least one anti-diffusion layer 30, the at least one N current spreading layer 40, and the at least one distributed Bragg reflector 50 on the epitaxial unit 10. Specifically, the epitaxial unit 10 comprises a substrate 11, an N-type layer (N-type conductive layer) 12, an active layer 13, and a P-type layer (P-type conductive layer) 14, wherein the substrate 11, the N-type layer 12, the active layer 13, and the P-type layer 14 are sequentially stacked, so that the N-type layer 12 is remained between the substrate 11 and the active layer 13, and the active layer 13 is remained between the N-type layer 12 and the P-type layer 14. In other words, the active layer 13 is remained between the N-type layer 12 and the P-type layer 14, wherein when the N-type layer 12 and the P-type layer 14 are input with an operating voltage, a current is flowing through the active layer 13 to generate light, and the light generated by the active layer 13 can be radiated to the outside via the substrate 11. In addition, the light generated by the active layer 13 is also radiated toward the P-type layer 14. The at least one reflective layer 20 of the present invention can reflect the light radiated toward the P-type layer 14. The at least one distributed Bragg reflector 50 can further reflect the light radiated toward the P-type layer 14. The flip-chip of the present invention can increase the area of the reflecting surface formed by the at least one distributed Bragg reflector 50 and the at least one reflective layer 20 in a manner of providing the at least one distributed Bragg reflector 50, so that the reflectivity of the non-covered area of the P-type layer 14 of the flip-chip by the at least one reflective layer 20 is greatly increased to improve the luminance of the light emitting diode.

Preferably, the substrate 11 of the epitaxial unit 10 is a transparent substrate to allow light generated from the active layer 13 to emit to the outside through the substrate 11. For example, the substrate 11 can be, but not limited to, a sapphire substrate. Preferably, the N-type layer 12 of the epitaxial unit 10 can be, but not limited to, an N-type gallium nitride layer. Preferably, the P-type layer 14 of the epitaxial unit 10 can be, but not limited to, a P-type gallium nitride layer.

As shown in FIGS. 1A and 1B, the epitaxial unit 10 has at least one N-type layer exposed portion 15, wherein the at least one N-type layer exposed portion 15 is extended from the outer side surface 141 of the P-type layer 14 via the active layer 13 towards the N-type layer 12, such that at least a partial area of the N-type layer 12 is exposed. In other words, the N-type layer 12 and the P-type layer 14 have exposed surfaces on the same side of the epitaxial unit 10, for successively and respectively connecting with the at least one N-type electrode 60 and the at least one P-type electrode 70.

Preferably, the N-type layer 12 forms a part of the at least one N-type layer exposed portion 15, that is the thickness of the N-type layer 12 in the area with respect to the at least one N-type layer exposed portion 15 is smaller than the thickness of the N-type layer 12 in the area with respect to the active layer 13. In other words, the at least one N-type layer exposed portion 15 is extended from the outer side surface 141 of the P-type layer 14 to a middle portion of the N-type layer 12 through the active layer 13.

It is worth to mention that the formation method of the at least one N-type layer exposed portion 15 on the epitaxial unit 10 is not limited in the manufacturing method of the flip-chip of the present invention. For example, in a specific embodiment of the flip-chip of the present invention, the at least one N-type layer exposed portion 15 can be formed on the epitaxial unit 10 by means of an etching process. Specifically, the epitaxial unit 10 is firstly coated photolithographically with a positive photoresist, so that the area needed to be etched is exposed. When the epitaxial unit 10 is photolithographically formed using the positive photoresist, the thickness of the positive photoresist is designed to be ranging from 3 μm to 5 μm (including 3 μm and 5 μm). Preferably, the epitaxial unit 10 can be baked after photolithography of the epitaxial unit 10 using the positive photoresist. Then, the area of the epitaxial unit 10 needed to be etched is dry etched. For example, the area of the epitaxial unit 10 needed to be etched is dry etched using, but not limited to, an Inductive Coupled Plasma Emission Spectrometer (ICP). The gas(es) used in the dry etching of the epitaxial unit 10 can be selected from at least chlorine gas ($Cl_2$), boron trichloride ($BCl_3$), or argon gas (Ar). An etching depth for dry etching the epitaxial unit 10 can be ranging from 0.9 μm to 2 μm (including 0.9 μm and 2 μm), so as to obtain the at least one N-type layer exposed portion 15 extended from the outer side surface 141 of the P-type layer 14 via the active layer 13 to the N-type layer 12. After etching the epitaxial unit 10 to form the at least one N-type layer exposed portion 15 extended from the outer side surface 141 of the P-type layer 14 via the active layer 13 to the N-type layer 12, the residual photoresist of the surface of the epitaxial unit 10 is removed to obtain the epitaxial unit 10 as shown in FIGS. 1A and 1B.

Those skilled in the art would understand that, in other alternative examples or embodiments of the flip-chip of the present invention, if the epitaxial unit 10 is provided with the at least one N-type layer exposed portion 15 extended from the outer side surface 141 of the P-type layer 14 via the active layer 13 to the N-type layer 12, during the manufacturing method of the flip-chip, the at least one N-type layer exposed portion 15 is not necessary to be re-formed on the epitaxial unit 10.

It is worth mentioning that the types of several N-type layer exposed portions 15 of the epitaxial unit 10 can be different from each other. For example, to the flip-chip of the present invention as shown in FIG. 1B, the epitaxial unit 10 has two types of the at least one N-type layer exposed portion 15, wherein one type of the at least one N-type layer exposed portion 15 has a circular cross-section extended form the P-type layer 14 via the active layer 13 to the N-type layer 12, wherein the other type of the at least one N-type layer exposed portion 15 has an exposed pad portion and an exposed extension portion from the exposed pad portion. The exposed pad portion and the exposed extension portion are both extended from the P-type layer 14 via the active layer 13 to the N-type layer 12.

Figure 2A:
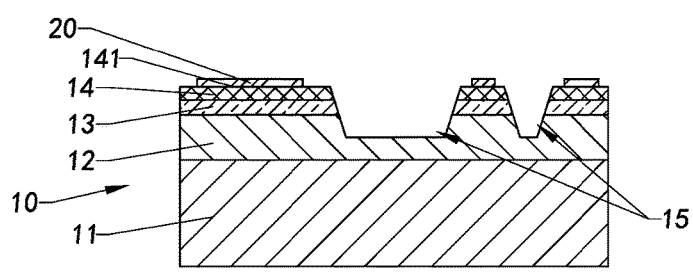
FIG. 2A is a sectional view illustrating the step two of the manufacturing method of the flip-chip according to the above preferred embodiment of the present invention.
Figure 2B:
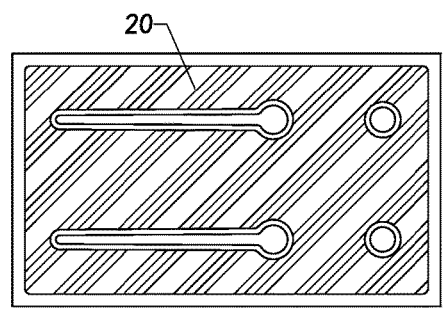
FIG. 2B is a top view illustrating the step two of the manufacturing method of the flip-chip according to the above preferred embodiment of the present invention.

As shown in FIGS. 2A and 2B, the at least one reflective layer 20 is formed on the outer side surface 141 of the P-type layer 14 of the epitaxial unit 10. Preferably, the at least one reflective layer 20 is a silver reflective layer configured to increase the reflectivity of the at least one reflective layer 20 to ensure the luminance of the light emitting diode. Specifically, firstly, the area where the at least one reflective layer 20 needs to be formed on is determined at the outer side surface 141 of the P-type layer 14 of the epitaxial unit 10. Preferably, after the area where the at least one reflective layer 20 needs to be formed on the outer side surface 141 of the P-type layer 14 of the epitaxial unit 10 is determined, the at least one reflective layer 20 can be formed by deposition on the area, so that the at least one reflective layer 20 is disposed on the outer side surface 141 of the P-type layer 14.

More specifically, a pattern or outline of the at least one reflective layer can be photolithographically deposited on the P-type layer 14 of the epitaxial unit 10 using a negative photoresist, and then at least one reflective layer can be formed by evaporated or sputtered coating upon the pattern of the at least one reflective layer. And at this time, the at least one reflective layer 20 is formed on the outer side surface 141 of the P-type layer 14 of the epitaxial unit 10. For example, in a more specific embodiment of the flip-chip of the present invention, the negative photoresist can be used on the P-type layer 14 of the epitaxial unit 10 to lithographically photoetch the pattern of a Mirror structure needed to be deposited. Then, the Mirror layer is deposited on the outer side surface 141 of the P-type layer 14 of the epitaxial unit 10 by evaporated or sputtered coating. In other words, in a specific embodiment of the flip-chip of the present invention, the at least one reflective layer 20 formed on the outer side surface 141 of the P-type layer 14 of the epitaxial unit 10 can be formed the Mirror layer on the outer side surface 141 of the P-type layer 14 of the epitaxial unit 10.

Preferably, the at least one reflective layer 20 is a stacked structure of silver (Ag) and titanium tungsten (TiW), wherein the thickness of the silver (Ag) is ranging from 100 angstroms to 5000 angstroms (including 100 angstroms and 5000 angstroms), wherein the thickness of the titanium tungsten (TiW) is ranging from 200 angstroms to 5000 angstroms (including 200 angstroms and 5000 angstroms).

After the pattern of the at least one reflective layer needed to be deposited on the P-type layer 14 of the epitaxial unit 10 using a negative photoresist is lithographically photoetched and the at least one reflective layer 20 is deposited at the pattern of the at least one reflective layer using evaporated or sputtered coating, a flip-chip semi-finished product 100 can be further processed. For example, an excess metal layer is firstly stripped off, and then the remaining photoresist on the surface of the flip-chip semi-finished product 100 is removed. In the flip-chip of the present invention, the method of stripping off the excess metal layer of the flip-chip semi-finished product 100 is not limited. For example, the remaining photoresist on the surface of flip-chip semi-finished product 100 can be stripped off by blue film technology.

Figure 3A:
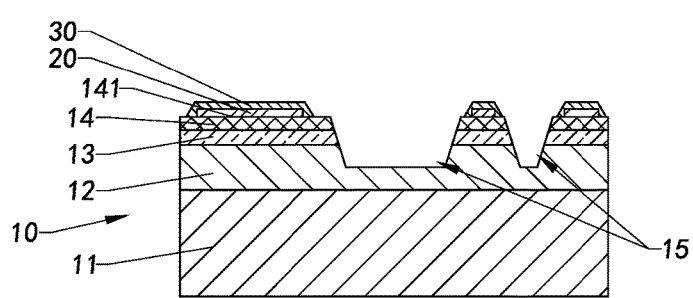
FIG. 3A is a sectional view illustrating the step three of the manufacturing method of the flip-chip according to the above preferred embodiment of the present invention.
Figure 3B:
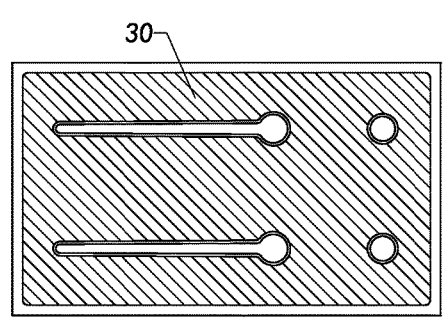
FIG. 3B is a top view illustrating the step three of the manufacturing method of the flip-chip according to the above preferred embodiment of the present invention.

As shown in FIGS. 3A and 3B, the at least one anti-diffusion layer 30 is formed on the outer side surface 141 of the P-type layer 14 of the epitaxial unit 10. The at least one anti-diffusion layer 30 is electrically connected with the P-type layer 14, wherein the at least one anti-diffusion layer 30 covers the at least one reflective layer 20 to prevent the at least one reflective layer 20 from a migration phenomenon. Preferably, the at least one anti-diffusion layer 30 fully covers the at least one reflective layer 20. In other words, the size of the at least one anti-diffusion layer 30 is larger than the size of the at least one reflective layer 20 to prevent any area of the at least one reflective layer 20 from being exposed via the at least one anti-diffusion layer 30, thereby preventing the at least one reflective layer 20 from the migration phenomenon that is unfavorable to ensure the reliability and stability of the flip-chip. Specifically, firstly, an area where the at least one anti-diffusion layer 20 needs to be formed on is determined at the P-type layer 14 of the epitaxial unit 10, and then the at least one anti-diffusion layer 30 is formed in the area, and the at least one anti-diffusion layer 30 is ensured to fully cover the at least one reflective layer 20. Preferably, after the area where the at least one anti-diffusion layer 30 needs to be formed on the P-type layer 14 of the epitaxial unit 10 is determined, the at least one anti-diffusion layer 30 can be formed on the area by deposition, and the at least one anti-diffusion layer 30 fully covers the at least one reflective layer 20.

More specifically, a pattern of the at least one anti-diffusion layer to be deposited can be photolithographically deposited on the P-type layer 14 of the epitaxial unit 10 using a negative photoresist, and then the at least one anti-diffusion layer 30 is lithographically photoetched by evaporated or sputtered coating on the pattern of the at least one anti-diffusion layer to be deposited. Meanwhile, the at least one anti-diffusion layer 30 is formed on the outer side surface 141 of the P-type layer 14 of the epitaxial unit 10, and the at least one reflective layer 20 is fully covered by the at least one anti-diffusion layer 30. For example, in a more specific embodiment of the flip-chip of the present invention, a negative photoresist can be used to lithographically deposit a Barrier layer to be deposited on the outer side surface 141 of the P-type layer 14 of the epitaxial unit 10. Then the Barrier layer is deposited on the outer side surface 141 of the P-type layer 14 of the epitaxial unit 10 by evaporated or sputtered coating to fully cover the at least one reflective layer 20. In other words, in a specific embodiment of the flip-chip of the present invention, the at least one anti-diffusion layer 30 being formed on the outer side surface 141 of the P-type layer 14 of the epitaxial unit 10 and covering the at least one reflective layer 20 can be the Barrier layer being formed on the outer side surface 141 of the P-type layer 14 of the epitaxial unit 10 and covering the at least one reflective layer 20.

Preferably, the at least one anti-diffusion layer 30 is an in stacked structure, wherein the material forming the at least one anti-diffusion layer 30 is selected from the group consisting of titanium tungsten (TiW), titanium (Ti), platinum (Pt), aluminum (Al), nickel (Ni) and gold (Au). Specifically, the one kind of material of the at least one anti-diffusion layer 30 can be selected from the group consisting of titanium tungsten (TiW), titanium (Ti), platinum (Pt), aluminum (Al), nickel (Ni), and gold (Au). Two or more kinds of materials selected from the group consisting of titanium tungsten (TiW), titanium (Ti), platinum (Pt), aluminum (Al), nickel (Ni), and gold (Au).

After the pattern of the at least one reflective layer needed to be deposited on the P-type layer 14 of the epitaxial unit 10 using a negative photoresist is lithographically photoetched and the at least one anti-diffusion layer 30 is deposited at the pattern of the at least one reflective layer using evaporated or sputtered coating, a flip-chip semi-finished product 100 can be further processed. For example, an excess metal layer is firstly stripped off, and then the remaining photoresist on the surface of the flip-chip semi-finished product 100 is removed. In the flip-chip of the present invention, the method of stripping off the excess metal layer of the flip-chip semi-finished product 100 is not limited. For example, the remaining photoresist on the surface of flip-chip semi-finished product 100 can be stripped off by blue film technology.

Figure 4A:
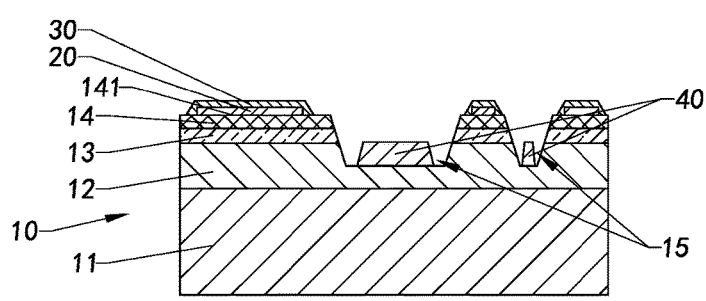
FIG. 4A is a sectional view illustrating the step four of the manufacturing method of the flip-chip according to the above preferred embodiment of the present invention.
Figure 4B:
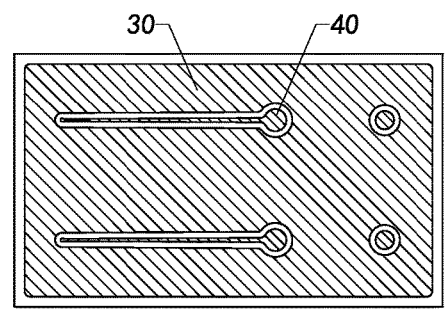
FIG. 4B is a top view illustrating the step four of the manufacturing method of the flip-chip according to the above preferred embodiment of the present invention.

As shown in FIGS. 4A and 4B, the at least one N current spreading layer 40 remained inside the at least one N-type layer exposed portion 15 is formed in the N-type layer 12 of the epitaxial unit 10. In other words, the at least one N current spreading layer 40 is extended from the N-type layer 12 toward the P-type layer 14 inside the at least one N-type layer exposed portion 15, and the at least one N current spreading layer 40 is electrically connected with the N-type layer 12. Preferably, the outer side surface 41 of the at least one N current spreading layer 40 is lower than the outer side surface 141 of the P-type layer 14. More preferably, the outer side surface 41 of the at least one N current spreading layer 40 is lower than the contact surface of the active layer 13 and the P-type layer 14. It is worth to be mentioned that the material of the at least one N current spreading layer 40 is not limited in the flip-chip of the present invention. For example, the at least one N current spreading layer 40 can be, but not limited to, an N current spreading metal layer.

More specifically, a pattern of the at least one N current spreading layer to be deposited can be photolithographically formed on the N-type layer 12 of the epitaxial unit 10 using a negative photoresist, and then the at least one N current spreading layer 40 is photolithographically formed by evaporated or sputtered coating on the pattern of the at least one N current spreading layer. A peripheral wall of the at least one N current spreading layer 40 and the active layer 13 have a safe distance therebetween, and a peripheral wall of the at least one N current spreading layer 40 and the P-type layers 14 have a safety distance therebetween, so as to prevent the at least one N current spreading layer 40 from contacting the active layer 13 and to prevent the at least one N current spreading layer 40 from contacting the P-type layer 14. For example, in a more specific embodiment of the flip-chip of the present invention, a negative photoresist can be used to lithographically pattern the at least one N current spreading layer to be deposited on the N-type layer 12 of the epitaxial unit 10. Then the at least one N current spreading layer 40 remained by the at least one N-type layer exposed portion 15 is deposited on the N-type layer 12 by evaporated or sputtered coating. Preferably, the structure of the at least one N current spreading layer 40 is an electrode structure of chromium (Cr), aluminum (Al), titanium (Ti), platinum (Pt), gold (Au), nickel (Ni). In other words, the material of the at least one N current spreading layer 40 is selected from the group consisting of chromium (Cr), aluminum (Al), titanium (Ti), platinum (Pt), gold (Au), and nickel (Ni). Specifically, the material of the at least one N current spreading layer 40 can be selected one material from chromium (Cr), aluminum (Al), titanium (Ti), platinum (Pt), gold (Au), and nickel (Ni), or selected two or more kinds of materials selected from the group consisting of chromium (Cr), aluminum (Al), and titanium (Ti), platinum (Pt), gold (Au) and nickel (Ni).

When a pattern of at least one N current spreading layer to be deposited is lithographically patterned by the negative photoresist in the N-type layer 12 of the epitaxial unit 10, and after the at least one N current spreading layer 40 is deposited on the pattern of the at least one N current spreading layer by evaporated or sputtered coating, a flip-chip semi-finished product 100 can be further processed. For example, an excess metal layer is firstly stripped off, and then the remaining photoresist on the surface of the flip-chip semi-finished product 100 is removed. In the flip-chip of the present invention, the method of stripping off the excess metal layer of the flip-chip semi-finished product 100 is not limited. For example, the remaining photoresist on the surface of flip-chip semi-finished product 100 can be stripped off by blue film technology.

Figure 5A:
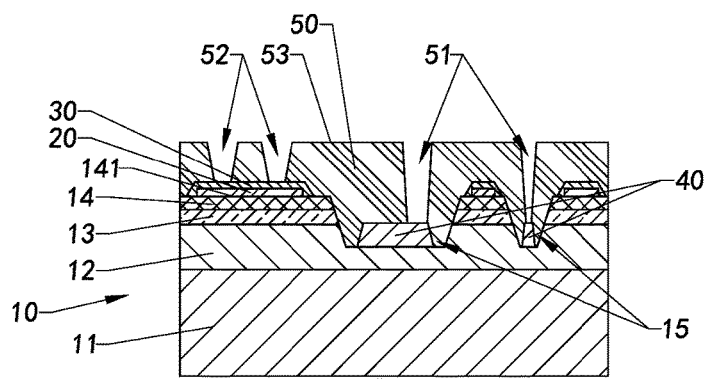
FIG. 5A is a sectional view illustrating the step five of the manufacturing method of the flip-chip according to the above preferred embodiment of the present invention.
Figure 5B:
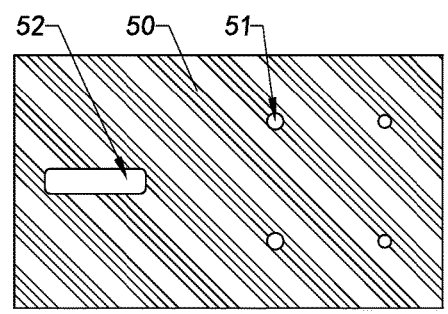
FIG. 5B is a top view illustrating the step five of the manufacturing method of the flip-chip according to the above preferred embodiment of the present invention.

As shown in FIGS. 5A and 5B, the at least one distributed Bragg reflector (DBR) 50 is formed on the surface of the flip-chip semi-finished product 100, wherein the at least one distributed Bragg reflector 50 integrally combines the N-type layer 12, the active layer 13, the P-type layer 14, the at least one anti-diffusion layer 30, and the at least one N current spreading layer 40. In other words, the at least one distributed Bragg reflector 50 can fill the at least one N-type layer exposed portion 15. It is worth to mention that in other alternative embodiments of the flip-chip of the present invention, the at least one distributed Bragg reflector 50 can also be only integrally connected with the N-type layer 12 and the active layer 13, the at least one anti-diffusion layer 30 and the at least one N current spreading layer 40.

It is worth mentioning that since the at least one reflective layer 20 formed on the outer side surface 141 of the P-type layer 14 cannot cover the entire area of the outer side surface 141 of the P-type layer 14, at least a portion of the outer side surface 141 of the P-type layer 14 is incapable of reflecting light generated from the active layer 13. In the flip-chip of the present invention, the area of the P-type layer 14 not covered by the at least one reflective layer 20 can be further covered by the at least one distributed Bragg reflector 50, so as to increase the area of the reflective surface formed by the at least one reflective layer 20 and the area of the reflective surface formed by the at least one distributed Bragg reflector 50, which can increase the reflectivity of the flip-chip, that is very important for greatly increasing the overall luminance of the light emitting diode.

The at least one distributed Bragg reflector 50 has one or more N-type layer channels 51 and one or more P-type layer channels 52, wherein the one or more N-type layer channels 51 are formed corresponding to at least a portion of the N-current spreading layer 40, wherein the one or more P-type layer channels 52 are formed corresponding to at least a portion of the area of the diffusion barrier layer 30. Later the at least one N-type electrode 60 formed on the outer side surface 53 of the at least one distributed Bragg reflector 50 can be electrically connected with the at least one N current spreading layer 40 via the one or more N-type layer channels 51 of the at least one distributed Bragg reflector 50. Correspondingly, the at least one P-type electrode 70 formed on the outer side surface 53 of the at least one distributed Bragg reflector 50 can be electrically connected with the at least one anti-diffusion layer 30 via the one or more P-type layer channels 52 of the at least one distributed Bragg reflector 50.

In a specific embodiment of the flip-chip of the present invention, the at least one distributed Bragg reflector 50 can be formed on the surface of the flip-chip semi-finished product 100 using an evaporated coating, so that the at least one distributed Bragg reflector 50 is capable of integrally connected with the N-type layer 12, the active layer 13, the P-type layer 14, the at least one anti-diffusion layer 30, and the at least one N current spreading layer 40. Preferably, the at least one distributed Bragg reflector 50 is in a stacked structure of silicon oxide, titanium oxide, magnesium fluoride, cerium oxide, aluminum oxide, and aluminum nitride, so as to improve the reflectance of the at least one distributed Bragg reflector 50, thereby increasing the overall luminance of the light emitting diode. Specifically, the at least one distributed Bragg reflector 50 is formed of a film layer stack with at least two refractive indices. The material of the film layer of the at least one distributed Bragg reflector 50 is selected from the group consisting of silicon oxide, titanium oxide, magnesium fluoride, cerium oxide, aluminum oxide, and aluminum nitride. In addition, different pairs of reflective layers can be designed for different wavelengths. Preferably, the pairs of reflective layer and the at least one distributed Bragg reflector 50 are between 20 pairs and 50 pairs (including 20 pairs and 50 pairs).

After the at least one distributed Bragg reflector 50 is combined with the N-type layer 12, the active layer 13, the P-type layer 14, the at least one anti-diffusion layer 30, and the N-current spreading layer 40 are integrally formed on the surface of the flip-chip semi-finished product 100. The at least one distributed Bragg reflector 50 is lithographically photoetched and coated to form the one or more N-type layer channels 51 and the one or more P-type layer channels 52 of the at least one distributed Bragg reflector 50, wherein the one or more N-type layer channels 51 are extended to the at least one N current spreading layer 40 to expose at least a portion of the at least one N current spreading layer 40, and correspondingly the one or more P-type layer channels 52 are extended to the at least one anti-diffusion layer 30 to expose at least a portion of the at least one anti-diffusion layer 30.

Specifically, in a specific embodiment of the flip-chip of the present invention, the at least one distributed Bragg reflector 50 is firstly photolithographically coated with a positive photoresist, so that the area of distributed Bragg reflector 50 that needs to be etched is exposed. The at least one distributed Bragg reflector 50 is then etched using the ICP machine to form the one or more N-type layer channels 51 and the one or more P-type layer channels 52 in the at least one distributed Bragg reflector 50.

Figure 6A:
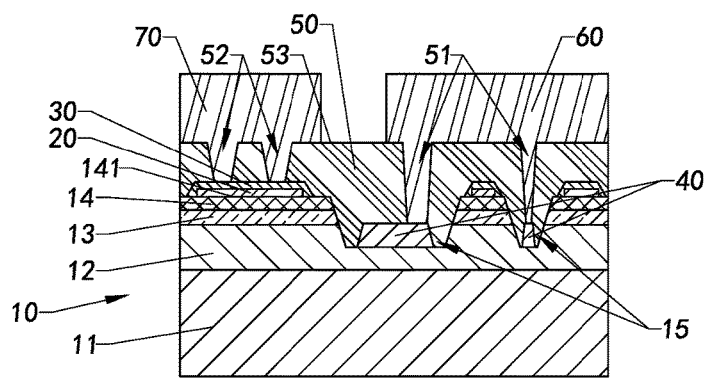
FIG. 6A is a sectional view illustrating the step six of the manufacturing method of the flip-chip according to the above preferred embodiment of the present invention.
Figure 6B:
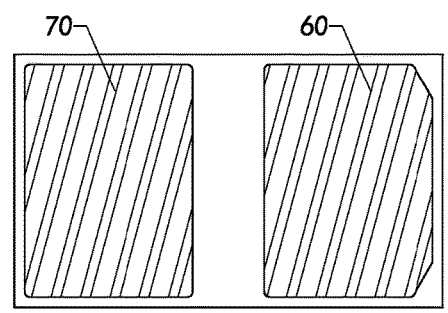
FIG. 6B is a top view illustrating the step six of the manufacturing method of the flip-chip according to the above preferred embodiment of the present invention.

As shown in FIGS. 6A and 6B, the at least one N-type electrode 60 and the at least one P-type electrode 70 are respectively formed in different areas of the outer side surface 53 of the at least one distributed Bragg reflector 50, wherein the at least one N-type electrode 60 is extended to and is electrically connected with the at least one N current spreading layer 40 via the one or more N-type layer channels 51 of the at least one distributed Bragg reflector 50, and correspondingly, the at least one P-type electrode 70 is extended to and is electrically connected with the at least one anti-diffusion layer 30 via the one or more P-type layer channels 52 of the at least one distributed Bragg reflector 50.

Specifically, in a specific embodiment of the flip-chip of the present invention, the at least one N-type electrode 60 and the at least one P-type electrode 70 are negative lithography and peeling formed on the outer side surface 53 of the at least one distributed Bragg reflector 50. More specifically, a pattern of electrodes to be deposited can be lithographically patterned on the outer side surface 53 of the at least one distributed Bragg reflector 50 using a negative photoresist, and then the at least one N-type electrode 60 and the at least one P-type electrode 70 are etched using evaporated or sputtered coating on the pattern. The at least one N-type electrode 60 is extended to and is electrically connected with the at least one N current spreading layer 40 via the one or more N-type layer channels 51 of the at least one distributed Bragg reflector 50. Correspondingly, the at least one P-type electrode 70 is extended to and electrically connected with the at least one anti-diffusion layer 30 via the one or more P-type layer channels 52 of the at least one distributed Bragg reflector 50. After a pattern of electrodes to be deposited is formed on the outer side surface 53 of the at least one distributed Bragg reflector 50 using a negative photoresist, and the at least one N-type electrode 60 and the at least one P-type electrode 70 are deposited on the lithographically patterned pattern of electrodes by evaporated or sputtered coating, a flip-chip semi-finished product 100 can be further processed. For example, an excess metal layer is firstly stripped off, and then the remaining photoresist on the surface of the flip-chip semi-finished product 100 is removed. In the flip-chip of the present invention, the method of stripping off the excess metal layer of the flip-chip semi-finished product 100 is not limited. For example, the remaining photoresist on the surface of flip-chip semi-finished product 100 can be stripped off by blue film technology, so as to obtain the flip-chip.

Preferably, the structures of the at least one N-type electrode 60 and the at least one P-type electrode 70 are chromium (Cr), aluminum (Al), titanium (Ti), platinum (Pt), gold (Au), nickel (Ni), gold tin (AuSn) electrode structure. In other words, the materials of the electrode structure of the at least one N-type electrode 60 and the at least one P-type electrode 70 are selected from the group consisting of chromium (Cr), aluminum (Al), titanium (Ti), platinum (Pt), gold (Au), tin (Sn), nickel (Ni), and gold tin (AuSn). Specifically, two or more materials of the electrode structure of the at least one N-type electrode 60 and the at least one P-type electrode 70 can be selected from a material group consisting of chromium (Cr), aluminum (Al), titanium (Ti), platinum (Pt), gold (Au), tin (Sn), nickel (Ni), and gold tin (AuSn), or two of the materials may be selected from the group consisting of chromium (Cr), aluminum (Al), titanium (Ti), platinum (Pt), gold (Au), tin (Sn), nickel (Ni), and gold tin (AuSn). The thickness of the at least one N-type electrode 60 and the thickness of the at least one P-type electrode 70 range from 0 μm to 7 μm (including 7 μm).

In other words, as shown in FIGS. 6A and 6B, a specific structure of the flip-chip according to the preferred embodiment of the present invention is illustrated, wherein the flip-chip comprises the epitaxial unit 10, the at least one reflective layer 20, the at least one anti-diffusion layer 30, the at least one N current spreading layer 40, the at least one distributed Bragg reflector 50, the at least one N-type electrode 60, and the at least one P-type electrode 70. The substrate 11, the N-type layer 12, the active layer 13, and the P-type layer 14 of the epitaxial unit 10 are sequentially stacked. The at least one N-type layer exposed portion 15 of the epitaxial unit 10 is extended from the outer side surface 141 of the P-type layer 14 to the N-type layer 12 via the active layer 13, such that at least a portion of the area of the N-type layer 12 is exposed. The at least one reflective layer 20 is formed on the outer side surface 141 of the P-type layer 14 of the epitaxial unit 10, and the at least one anti-diffusion layer 30 is formed on the outer side surface 141 of the P-type layer 14 of the epitaxial unit 10. The at least one anti-diffusion layer 30 fully covers the at least one reflective layer 20. The at least one N current spreading layer 40 is remained at the at least one N-type layer exposed portion 15 of the epitaxial unit 10, and the at least one N current spreading layer 40 is electrically connected with the N-type layer 12 of the epitaxial unit 10. The at least one distributed Bragg reflector 50 integrally combines the N-type layer 12, the active layer 13, the P-type layer 14, the at least one anti-diffusion layer 30, and the at least one N current spreading layer 40, and that the one or more N-type layer channels 51 of the at least one distributed Bragg reflector 50 is extended to the at least one N current spreading layer 40, so that a portion of the at least one N current spreading layer 40 is exposed. The one or more P-type layer channels 52 of the at least one distributed Bragg reflector 50 are extended to the at least one anti-diffusion layer 30, so that a portion of the at least one anti-diffusion layer 30 is exposed. The at least one N-type electrode 60 is formed on the outer side surface 53 of the at least one distributed Bragg reflector 50, and the at least one N-type electrode 60 is extended to and electrically connected with the at least one N current spreading layer 40 via the one or more N-type layer channels 51 of the at least one distributed Bragg reflector 50. The at least one P-type electrode 70 is formed on the outer side surface 53 of the at least one distributed Bragg reflector 50, and the at least one P-type electrode 70 is extended to and electrically connected with the at least one anti-diffusion layer 30 via the one or more P-type layer channels 52 of the at least one distributed Bragg reflector 50.

When the at least one N-type electrode 60 and the at least one P-type electrode 70 are applied with an operating voltage, the active layer 13 of the epitaxial unit 10 is capable of generating light and radiating to the outside, wherein the light generated from the active layer 13 radiated toward the substrate 11 of the epitaxial unit 10 can be directly radiated to the outside via the substrate 11. And, the light generated by the active layer 13 in the direction of the at least one reflective layer 20 can be irradiated by the at least one reflective layer 20 to the outside via the substrate 11, and at the same time, the light generated by the active layer 13 in the direction of the at least one distributed Bragg reflector 50 can be reflected by the at least one distributed Bragg reflector 50 to the outside via the substrate 11. In such a manner, the reflectivity of the flip-chip can be greatly improved, so that the overall luminance of the light emitting diode can be improved, which is unexpected is prior art.

It is worth mentioning that the thicknesses of the substrate 11, the N-type layer 12, the active layer 13, the P-type layer 14, the at least one reflective layer 20, the at least one anti-diffusion layer 30, the at least one N current spreading layer 40, the at least one distributed Bragg reflector 50, the at least one N-type electrode 60, and the at least one P-type electrode 70 of the flip-chip as shown in the drawings of the present invention are merely for illustration purpose as example, but not intending to represent the actual real thicknesses of the substrate 11, the N-type layer 12, the active layer 13, the P-type layer 14, the at least one reflective layer 20, the at least one anti-diffusion layer 30, the at least one N current spreading layer 40, the at least one distributed Bragg reflector 50, the at least one N-type electrode 60, and the at least one P-type electrode 70. Moreover, person skilled in the art should realize that the real dimensional proportion of the substrate 11, the N-type layer 12, the active layer 13, the P-type layer 14, the at least one reflective layer 20, the at least one anti-diffusion layer 30, the at least one N current spreading layer 40, the at least one distributed Bragg reflector 50, the at least one N-type electrode 60, and the at least one P-type electrode 70 are not exactly in proportional dimension as shown in the drawings. Moreover, the real dimensional proportion of the at least one N-type electrode 60 and the at least one P-type electrode 70 and the real proportion between the at least one N-type electrode 60, the at least one P-type electrode 70 and other layers of the flip-chip are not exactly in proportional dimension as shown in the drawings.

As shown in FIGS. 7A to 13B of the present invention, a flip-chip of light emitting diode according to another preferred embodiment of the present invention is disclosed and illustrated, wherein the flip-chip comprises an epitaxial unit 10A, at least one reflective layer 20A, at least one anti-diffusion layer 30A, at least one N current spreading layer 40A, at least one distributed Bragg reflector 50A, at least one N-type electrode 60A, and at least one P-type electrode 70A.

Figure 7A:
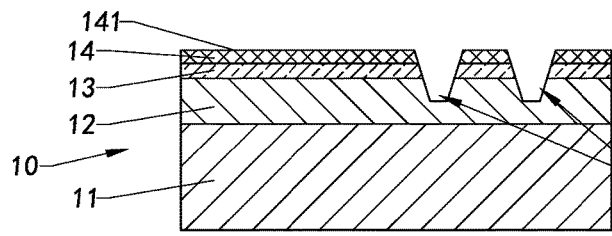
FIG. 7A is a sectional view illustrating the step one of the manufacturing method of a flip-chip of light emitting diode according to the other preferred embodiment of the present invention.
Figure 7B:
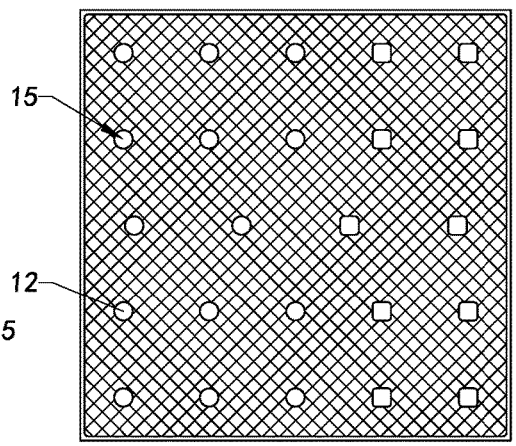
FIG. 7B is a top view illustrating the step one of a manufacturing method of the flip-chip according to the another preferred embodiment of the present invention.

As shown in FIGS. 7A and 7B, in the process of manufacturing the flip-chip, the epitaxial unit 10A is firstly provided for subsequent forming the at least one reflective layer 20A on the epitaxial unit 10A. Specifically, the epitaxial unit 10A comprises a substrate 11A, an N-type layer 12A, an active layer 13A, and a P-type layer 14A, wherein the substrate 11A, the N-type layer 12A, and the active layer 13A and the P-type layer 14A are sequentially stacked, so that the N-type layer 12A is remained between the substrate 11A and the active layer 13A, and the active layer 13A is remained between the N-type layer 12A and the P-type layer 14A. In other words, the active layer 13A isolates the N-type layer 12A and the P-type layer 14A, wherein when the N-type layer 12A and the P-type layer 14A are applied with an operating voltage, the active layer 13A is capable of generating light, and the light generated by the active layer 13A can be radiated to the outside via the substrate 11A.

Preferably, the substrate 11A of the epitaxial unit 10A is a transparent substrate to allow light generated from the active layer 13A to emit to the outside through the substrate 11A. For example, the substrate 11A can be, but not limited to, a sapphire substrate. Preferably, the N-type layer 12A of the epitaxial unit 10A can be, but not limited to, an N-type gallium nitride layer. Preferably, the P-type layer 14A of the epitaxial unit 10A can be, but not limited to, a P-type gallium nitride layer.

As shown in FIGS. 7A and 7B, the epitaxial unit 10A has at least one N-type layer exposed portion 15A, wherein the at least one N-type layer exposed portion 15A is extended from the outer side surface 141A of the P-type layer 14A via the active layer 13A towards the N-type layer 12A, such that at least a partial area of the N-type layer 12A is exposed. In other words, the N-type layer 12A and the P-type layer 14A have exposed surfaces on the same side of the epitaxial unit 10A, for successively and respectively connecting with the at least one N-type electrode 60A and the at least one P-type electrode 70A.

Preferably, the N-type layer 12A forms a part of the at least one N-type layer exposed portion 15A, that is, the thickness of the N-type layer 12A in the area in correspondence with the at least one N-type layer exposed portion 15A is smaller than the thickness of the N-type layer 12A in the area corresponding with the active layer 13A. In other words, the at least one N-type layer exposed portion 15A is extended from the outer side surface 141A of the P-type layer 14A to a middle portion of the N-type layer 12A through the active layer 13A.

It is worth mentioning that the formation method of the at least one N-type layer exposed portion 15A on the epitaxial unit 10A is not limited in the manufacturing method of the flip-chip of the present invention. For example, in a specific embodiment of the flip-chip of the present invention, the at least one N-type layer exposed portion 15A can be formed on the epitaxial unit 10A by means of an etching process. Specifically, the epitaxial unit 10A is firstly photolithographically coated with a positive photoresist, so that the area needed to be etched is exposed. When the epitaxial unit 10A is photolithographically formed using the positive photoresist, the thickness of the positive photoresist is designed to be ranging from 3 μm to 5 μm (including 3 μm and 5 μm). Preferably, the epitaxial unit 10A can be baked after photolithography of the epitaxial unit 10A using the positive photoresist. Then, the area of the epitaxial unit 10A needed to be etched is dry etched. For example, the area of the epitaxial unit 10A needed to be etched is dry etched using, but not limited to, an Inductive Coupled Plasma Emission Spectrometer (ICP). The gas(es) used in the dry etching of the epitaxial unit 10 can be selected from chlorine gas ($Cl_2$), boron trichloride ($BCl_3$), or argon gas (Ar). An etching depth for dry etching the epitaxial unit 10A can be ranging from 0.9 μm to 2 μm (including 0.9 μm and 2 μm), so as to obtain the at least one N-type layer exposed portion 15A extended from the outer side surface 141A of the P-type layer 14A via the active layer 13A to the N-type layer 12A. After etching the epitaxial unit 10A to form the at least one N-type layer exposed portion 15A extended from the outer side surface 141A of the P-type layer 14A via the active layer 13A to the N-type layer 12A, the residual photoresist of the surface of the epitaxial unit 10A is removed to obtain the epitaxial unit 10A as shown in FIGS. 7A and 7B.

Those skilled in the art would understand that in other alternative examples or embodiments of the flip-chip of the present invention, if the epitaxial unit 10A is provided with the at least one N-type layer exposed portion 15A extended from the outer side surface 141A of the P-type layer 14A via the active layer 13A to the N-type layer 12A, during the manufacturing method of the flip-chip, the at least one N-type layer exposed portion 15A is not necessary to be re-formed on the epitaxial unit 10A.

Figure 8A:
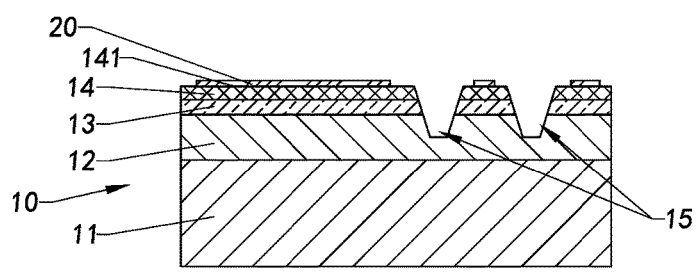
FIG. 8A is a sectional view illustrating the step two of the manufacturing method of the flip-chip according to the above preferred embodiment of the present invention.
Figure 8B:
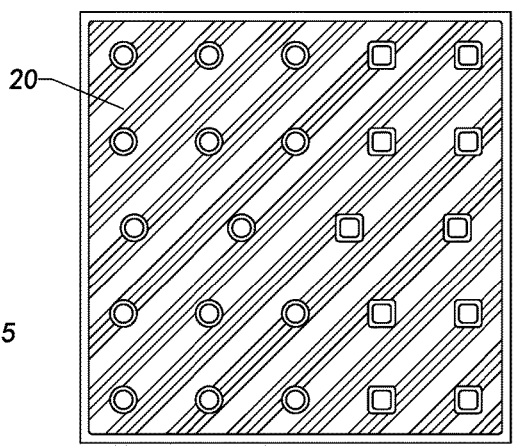
FIG. 8B is a top view illustrating the step two of the manufacturing method of the flip-chip according to the above preferred embodiment of the present invention.

As shown in FIGS. 8A and 8B, the at least one reflective layer 20A is formed on the outer side surface 141A of the P-type layer 14A of the epitaxial unit 10A. Preferably, the at least one reflective layer 20A is a silver reflective layer to increase the reflectivity of the at least one reflective layer 20A to ensure the luminance of the light emitting diode. Specifically, firstly, the area where the at least one reflective layer 20A needs to be formed on is determined at the outer side surface 141A of the P-type layer 14A of the epitaxial unit 10. Preferably, after the area where the at least one reflective layer 20A needs to be formed on the outer side surface 141A of the P-type layer 14A of the epitaxial unit 10A is determined, the at least one reflective layer 20A can be formed by deposition on the area, so that the at least one reflective layer 20A is disposed on the outer side surface 141A of the P-type layer 14A.

More specifically, a pattern or outline of the at least one reflective layer can be photolithographically deposited on the P-type layer 14A of the epitaxial unit 10A using a negative photoresist, and then at least one reflective layer can be formed by evaporated or sputtered coating upon the pattern of the at least one reflective layer. And at this time, the at least one reflective layer 20A is formed on the outer side surface 141A of the P-type layer 14A of the epitaxial unit 10A. For example, in a more specific embodiment of the flip-chip of the present invention, the negative photoresist can be used on the P-type layer 14A of the epitaxial unit 10A to lithographically photoetch the pattern of a Mirror structure needed to be deposited. Then, the Mirror layer is deposited on the outer side surface of the P-type layer 14A of the epitaxial unit 10A by evaporated or sputtered coating. In other words, in a specific embodiment of the flip-chip of the present invention, the at least one reflective layer 20A formed on the outer side surface 141A of the P-type layer 14A of the epitaxial unit 10A can be formed the Mirror layer on the outer side surface 141A of the P-type layer 14A of the epitaxial unit 10.

Preferably, the at least one reflective layer 20A is a stacked structure of silver (Ag) and titanium tungsten (TiW), wherein the thickness of the silver (Ag) is ranging from 100 angstroms to 5000 angstroms (including 100 angstroms and 5000 angstroms), wherein the thickness of the titanium tungsten (TiW) is ranging from 200 angstroms to 5000 angstroms (including 200 angstroms and 5000 angstroms).

After the pattern of the at least one reflective layer needed to be deposited on the P-type layer 14A of the epitaxial unit 10A using a negative photoresist is lithographically photoetched and the at least one reflective layer 20A is deposited at the pattern of the at least one reflective layer using evaporated or sputtered coating, a flip-chip semi-finished product 100A can be further processed. For example, an excess metal layer is firstly stripped off, and then the remaining photoresist on the surface of the flip-chip semi-finished product 100A is removed. In the flip-chip of the present invention, the method of stripping off the excess metal layer of the flip-chip semi-finished product 100A is not limited. For example, the remaining photoresist on the surface of flip-chip semi-finished product 100A can be stripped off by blue film technology.

Figure 9A:
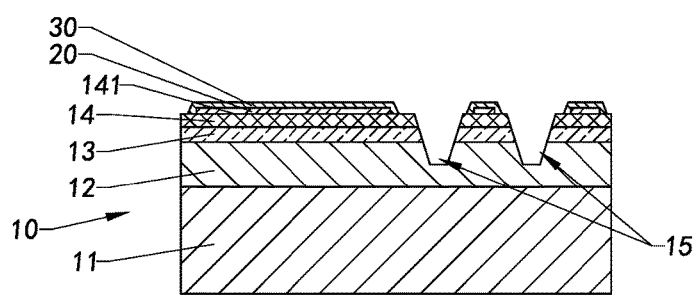
FIG. 9A is a sectional view illustrating the step three of the manufacturing method of the flip-chip according to the above preferred embodiment of the present invention.
Figure 9B:
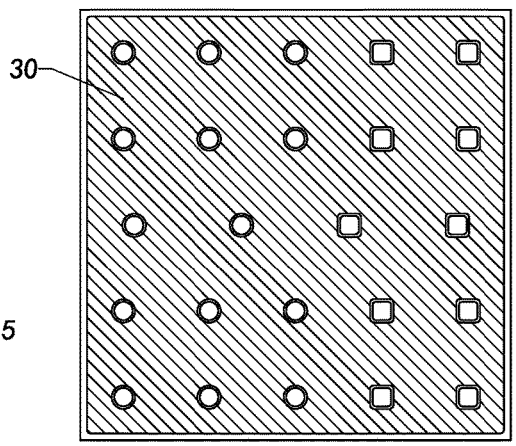
FIG. 9B is a top view illustrating the step three of the manufacturing method of the flip-chip according to the above preferred embodiment of the present invention.

As shown in FIGS. 9A and 9B, the at least one anti-diffusion layer 30A is formed on the outer side surface 141A of the P-type layer 14A of the epitaxial unit 10A. The at least one anti-diffusion layer 30A is electrically connected with the P-type layer 14A, wherein the at least one anti-diffusion layer 30A covers the at least one reflective layer 20A to prevent the at least one reflective layer 20A from a migration phenomenon. In other words, the size of the at least one anti-diffusion layer 30A is larger than the size of the at least one reflective layer 20A to prevent any area of the at least one reflective layer 20A from being exposed via the at least one anti-diffusion layer 30A, thereby preventing the at least one reflective layer 20A from the migration phenomenon that is unfavorable to ensure the reliability and stability of the flip-chip. Specifically, firstly, an area where the at least one anti-diffusion layer 20A needs to be formed on is determined at the P-type layer 14A of the epitaxial unit 10A, and then the at least one anti-diffusion layer 30A is formed in the area, and the at least one anti-diffusion layer 30A is ensured to fully cover the at least one reflective layer 20A. Preferably, after the area where the at least one anti-diffusion layer 30A needs to be formed on the P-type layer 14A of the epitaxial unit 10A is determined, the at least one anti-diffusion layer 30A can be formed on the area by deposition, and the at least one anti-diffusion layer 30A fully covers the at least one reflective layer 20A.

More specifically, a pattern of the at least one anti-diffusion layer to be deposited can be photolithographically deposited on the P-type layer 14A of the epitaxial unit 10A using a negative photoresist, and then the at least one anti-diffusion layer 30A is lithographically photoetched by evaporated or sputtered coating on the pattern of the at least one anti-diffusion layer to be deposited. Meanwhile, the at least one anti-diffusion layer 30A is formed on the outer side surface 141A of the P-type layer 14A of the epitaxial unit 10A, and the at least one reflective layer 20A is fully covered by the at least one anti-diffusion layer 30A. For example, in a more specific embodiment of the flip-chip of the present invention, a negative photoresist can be used to lithographically deposit a Barrier layer to be deposited on the outer side surface of the P-type layer 14A of the epitaxial unit 10A. Then the Barrier layer is deposited on the outer side 141A of the P-type layer 14A of the epitaxial unit 10A by evaporated or sputtered coating to fully cover the at least one reflective layer 20A. In other words, in a specific embodiment of the flip-chip of the present invention, the at least one anti-diffusion layer 30A being formed on the outer side surface 141A of the P-type layer 14A of the epitaxial unit 10A and covering the at least one reflective layer 20A can be the Barrier layer being formed on the outer side surface 141A of the P-type layer 14A of the epitaxial unit 10A and covering the at least one reflective layer 20A.

Preferably, the at least one anti-diffusion layer 30A is an in stacked structure, wherein the material forming the at least one anti-diffusion layer 30A is selected from the group consisting of titanium tungsten (TiW), titanium (Ti), platinum (Pt), aluminum (Al), nickel (Ni) and gold (Au). Specifically, the one kind of material of the at least one anti-diffusion layer 30A can be selected from the group consisting of titanium tungsten (TiW), titanium (Ti), platinum (Pt), aluminum (Al), nickel (Ni), and gold (Au). Two or more kinds of materials selected from the group consisting of titanium tungsten (TiW), titanium (Ti), platinum (Pt), aluminum (Al), nickel (Ni), and gold (Au).

After the pattern of the at least one reflective layer needed to be deposited on the P-type layer 14A of the epitaxial unit 10A using a negative photoresist is lithographically photoetched and the at least one anti-diffusion layer 30A is deposited at the pattern of the at least one reflective layer using evaporated or sputtered coating, a flip-chip semi-finished product 100A can be further processed. For example, an excess metal layer is firstly stripped off, and then the remaining photoresist on the surface of the flip-chip semi-finished product 100A is removed. In the flip-chip of the present invention, the method of stripping off the excess metal layer of the flip-chip semi-finished product 100A is not limited. For example, the remaining photoresist on the surface of flip-chip semi-finished product 100A can be stripped off by blue film technology.

Figure 10A:
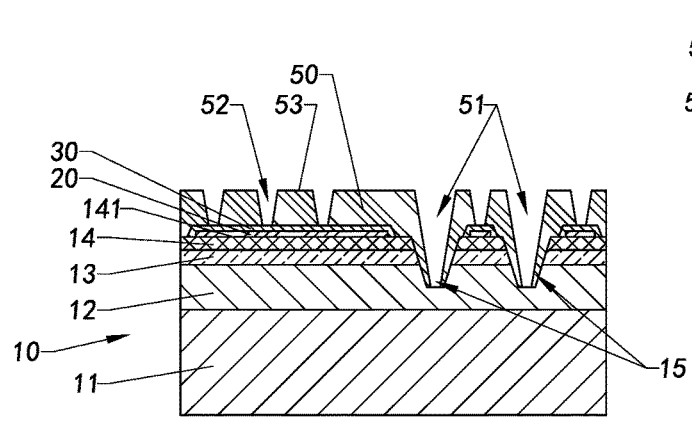
FIG. 10A is a sectional view illustrating the step four of the manufacturing method of the flip-chip according to the above preferred embodiment of the present invention.
Figure 10B:
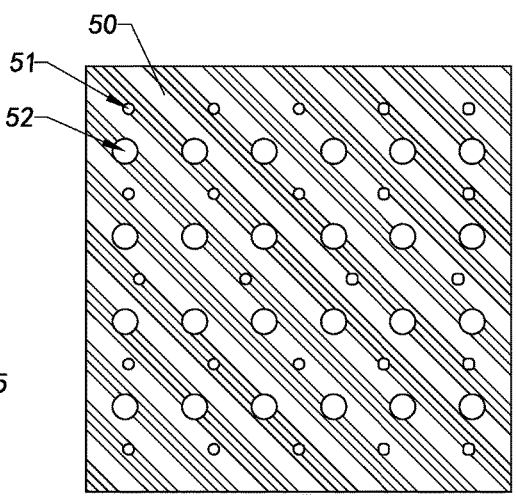
FIG. 10B is a top view illustrating the step four of the manufacturing method of the flip-chip according to the above preferred embodiment of the present invention.

As shown in FIGS. 10A and 10B, the at least one distributed Bragg reflector (DBR) 50A is formed on the surface of the flip-chip semi-finished product 100A, wherein the at least one distributed Bragg reflector 50A integrally combines the N-type layer 12A, the active layer 13A, the P-type layer 14A, and the at least one anti-diffusion layer 30A. Since the at least one reflective layer 20A formed on the outer side surface of the P-type layer 14A cannot cover the entire area of the outer side surface 141 of the P-type layer 14A, at least a portion of the outer side surface 141A of the P-type layer 14A is incapable of reflecting light generated from the active layer 13A. In the flip-chip of the present invention, the area of the P-type layer 14A not covered by the at least one reflective layer 20A can be further covered by the at least one distributed Bragg reflector 50A, so as to increase the area of the reflective surface formed by the at least one reflective layer 20A and the area of the reflective surface formed by the at least one distributed Bragg reflector 50A, which can increase the reflectivity of the flip-chip, that is very important for greatly increasing the overall luminance of the light emitting diode.

The at least one distributed Bragg reflector 50A has one or more N-type layer channels 51A and one or more P-type layer channels 52A, wherein the one or more N-type layer channels 51A are formed corresponding to a portion of the N-type layer 12A, and the one or more P-type layer channels 52A are formed corresponding to a portion of the P-type layer 14A.

In a specific embodiment of the flip-chip of the present invention, the at least one distributed Bragg reflector 50A can be formed on the surface of the flip-chip semi-finished product 100 using an evaporated coating, so that the at least one distributed Bragg reflector 50A is capable of integrally connected with the N-type layer 12A, the active layer 13A, the P-type layer 14A, and the at least one anti-diffusion layer 30A. Preferably, the at least one distributed Bragg reflector 50A is in a stacked structure of silicon oxide, titanium oxide, magnesium fluoride, cerium oxide, aluminum oxide, and aluminum nitride, so as to improve the reflectance of the at least one distributed Bragg reflector 50A, thereby increasing the overall luminance of the light emitting diode. Specifically, the at least one distributed Bragg reflector 50A is formed of a film layer stack with at least two refractive indices. The material of the film layer of the at least one distributed Bragg reflector 50A is selected from the group consisting of silicon oxide, titanium oxide, magnesium fluoride, cerium oxide, aluminum oxide, and aluminum nitride. Specifically, two or more kinds of material of the at least one distributed Bragg reflector 50A are selected from the group consisting of silicon oxide, titanium oxide, magnesium fluoride, cerium oxide, aluminum oxide, and aluminum nitride. In addition, different pairs of reflective layers can be designed for different wavelengths. Preferably, the pairs of reflective layer and the at least one distributed Bragg reflector 50A are between 20 pairs and 50 pairs (including 20 pairs and 50 pairs).

After the at least one distributed Bragg reflector 50A combined with the N-type layer 12A, the active layer 13A, the P-type layer 14A, and the at least one anti-diffusion layer 30A is integrally formed on the surface of the flip-chip semi-finished product 100A, the at least one distributed Bragg reflector 50A is lithographically photoetched and coated to form the one or more N-type layer channels 51A and the one or more P-type layer channels 52A of the at least one distributed Bragg reflector 50A, wherein the one or more N-type layer channels 51A are extended to the N-type layer 12A of the epitaxial unit 10A to expose at least a portion of the N-type layer 12A, and correspondingly the one or more P-type layer channels 52 are extended to the P-type layer 14A of the epitaxial unit 10A to expose at least a portion of the P-type layer 14A.

Specifically, in a specific embodiment of the flip-chip of the present invention, the at least one distributed Bragg reflector 50A is firstly photolithographically coated with a positive photoresist, so that the area of distributed Bragg reflector 50A that needs to be etched is exposed. The at least one distributed Bragg reflector 50A is then etched using the ICP machine to form the one or more N-type layer channels 51A and the one or more P-type layer channels 52A in the at least one distributed Bragg reflector 50A.

Figure 11A:
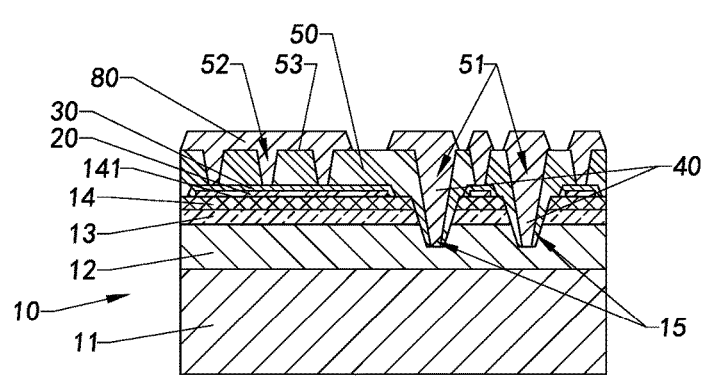
FIG. 11A is a sectional view illustrating the step five of the manufacturing method of the flip-chip according to the above preferred embodiment of the present invention.
Figure 11B:
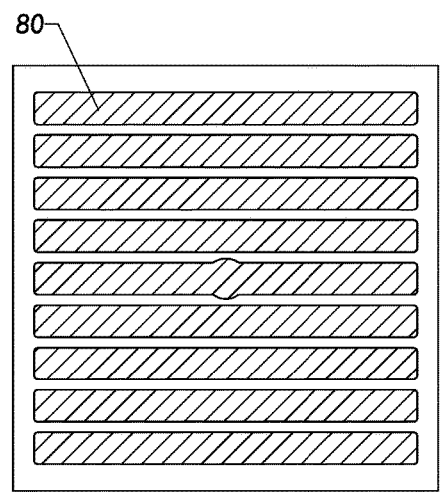
FIG. 11B is a top view illustrating the step five of the manufacturing method of the flip-chip according to the above preferred embodiment of the present invention.

As shown in FIGS. 11A and 11B, the at least one N current spreading layer 40A and at least one P current spreading layer 80A are respectively separately formed in the outer side surface 53A of the at least one distributed Bragg reflector 50A, wherein the at least one N current spreading layer 40A is extended to and is electrically connected with the N-type layer 12A of the epitaxial unit 10A via the one or more N-type layer channels 51A of the at least one distributed Bragg reflector 50A, and correspondingly, the at least one P current spreading layer 80A is extended to and is electrically connected with the P-type layer 14A via the one or more P-type layer channels 52A of the at least one distributed Bragg reflector 50A.

More specifically, the pattern of the at least one N current spreading layer to be deposited and the pattern of the at least one P current spreading layer to be deposited can be photolithographically etched on the outer side surface 53A of the at least one distributed Bragg reflector 50A using a negative photoresist. And then the at least one N current spreading layer 40A and the at least one P current spreading layer 80A are respectively deposited in a pattern of the etched N current spreading layer and the etched pattern of the at least one P current spreading layer by evaporated or sputtered coating, wherein there is a safe distance between the at least one N current spreading layer 40A and the at least one P current spreading layers 80A. For example, in a more specific embodiment of the flip-chip of the present invention, a negative photoresist can be used to lithographically pattern of the at least one N current spreading layer and the at least one N current spreading layer on the outer side surface 53A of the at least one distributed Bragg reflector 50A. And then depositing the at least one N current spreading layer 40A in the pattern of the at least one N current spreading layer by evaporated or sputtered coating, and the at least one N current spreading layer 40A is extended to and electrically connected with the N-type layer 12A of the epitaxial unit 10A via the he N-type layer channel 51A of the at least one distributed Bragg reflector 50A. And, the at least one P current spreading layer 80A is deposited in a pattern of the at least one P current spreading layer, and the at least one P current spreading layer 80A is extended to and is electrically connected with the P-type layer 14A via the one or more P-type layer channels 52A of the at least one distributed Bragg reflector 50A. Preferably, the structure of the at least one N current spreading layer 40A and the structure of the at least one P current spreading layer 80A are both in the electrode structure of chromium (Cr), aluminum (Al), titanium (Ti), platinum (Pt), gold (Au), and nickel (Ni). In other words, the materials forming the at least one N current spreading layer 40A and the at least one P current spreading layer 80A are each selected from the material group consisting of chromium (Cr), aluminum (Al), titanium (Ti), platinum (Pt), gold (Au), and nickel (Ni). Specifically, one kind of the material of the at least one N current spreading layer 40A and the at least one P current spreading layer 80A can be selected from chromium (Cr), aluminum (Al), titanium (Ti), platinum (Pt), gold (Au), and nickel (Ni). Two or more kinds of the materials can be selected from two or more of chromium (Cr), aluminum (Al), titanium (Ti), platinum (Pt), gold (Au), and nickel (Ni).

After the pattern of the at least one N current spreading layer to be deposited and the pattern of the at least one P current spreading layer to be deposited can be photolithographically etched on the outer side surface 53A of the at least one distributed Bragg reflector 50A using a negative photoresist, a flip-chip semi-finished product 100A can be further processed. For example, an excess metal layer is firstly stripped off, and then the remaining photoresist on the surface of the flip-chip semi-finished product 100A is removed. In the flip-chip of the present invention, the method of stripping off the excess metal layer of the flip-chip semi-finished product 100A is not limited. For example, the remaining photoresist on the surface of flip-chip semi-finished product 100A can be stripped off by blue film technology.

Figure 12A:
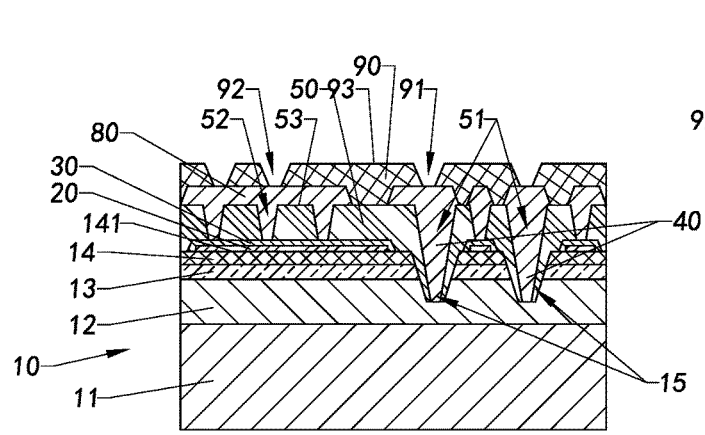
FIG. 12A is a sectional view illustrating the step six of the manufacturing method of the flip-chip according to the above preferred embodiment of the present invention.
Figure 12B:
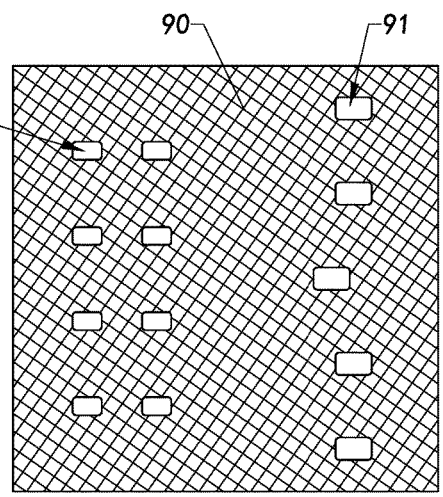
FIG. 12B is a top view illustrating the step six of the manufacturing method of the flip-chip according to the above preferred embodiment of the present invention.

As shown in FIGS. 12A and 12B, at least one insulating layer 90A is formed on the outer side of the flip-chip semi-finished product 100A, wherein the at least one insulating layer 90A is integrally connected with the at least one distributed Bragg reflector 50A, the at least one N current spreading layer 40A, and the at least one P current spreading layer 80A. Preferably, the at least one insulating layer 90A is capable of isolating the at least one N current spreading layer 40A against the at least one P current spreading layer 80A.

The at least one insulating layer 90A has one or more first channels 91A and one or more second channels 92A, wherein at least a portion of the at least one N current spreading layer 40A is formed corresponding to the one or more first channels 91A of the at least one insulating layer 90A, for subsequent allowing the at least one N-type electrode 60A to be extended to and electrically connected with the at least one N current spreading layer 40A via the one or more first channels 91A of the at least one insulating layer 90A, and correspondingly, at least a portion of the at least one P current spreading layer 80A is formed corresponding to at least a portion of the one or more second channels 92A of the at least one insulating layer 90A, for subsequent allowing the at least one P-type electrode 70A to be extended to and electrically connected with the at least one P current spreading layer 80A via the one or more second channels 92A of the at least one insulating layer 90A.

Preferably, in a specific embodiment of the flip-chip of the present invention, a Plasma Enhanced Chemical Vapor Deposition (PECVD) can be used to form the at least one insulating layer 90A outside the flip-chip semi-finished product 100A, wherein the gas used can be, but not limited to, monosilane ($SiH_4$), nitrous oxide ($N_2O$), or nitrogen ($N_2$). Preferably, the at least one insulating layer 90A has a thickness ranging from 5,000 angstroms to 20,000 angstroms (including 5000 angstroms and 20,000 angstroms) to ensure reliability and stability of the flip-chip.

It is worth mentioning that the manufacturing process in which the one or more first channels 91A and the one or more second channels 92A are formed in the at least one insulating layer 90A is not limited in the flip-chip of the present invention. For example, in a specific embodiment of the flip-chip of the present invention, the one or more first channels 91A and the one or more second channels 92A can be formed on the at least one insulating layer 90A by an etching process. Specifically, the at least one insulating layer 90A is firstly coated photolithographically with a positive photoresist to expose the area of the at least one insulating layer 90A that needs to be etched. Then, the area of the at least one insulating layer 90A that needs to be etched is dry etched. For example, the area of the at least one insulating layer 90A that needs to be etched can be dry etched using, but not limited to, an ICP machine, so as to form the one or more first channels 91A and the one or more second channels 92A on the at least one insulating layer 90A. The material of the at least one insulating layer 90A is selected from the group consisting of silicon oxide, silicon nitride, silicon oxynitride, aluminum oxide, and aluminum nitride. Specifically, the at least one insulating layer 90A can be selected from one of silicon oxide, silicon nitride, silicon oxynitride, aluminum oxide, and aluminum nitride. Two or more kinds of material can be selected from the group consisting of two or more of silicon oxide, silicon nitride, silicon oxynitride, aluminum oxide, and aluminum nitride.

Figure 13A:
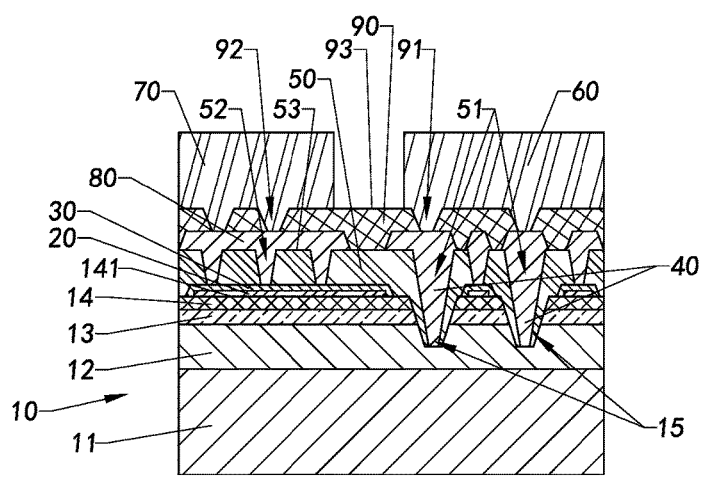
FIG. 13A is a sectional view illustrating the step seven of the manufacturing method of the flip-chip according to the above preferred embodiment of the present invention.
Figure 13B:
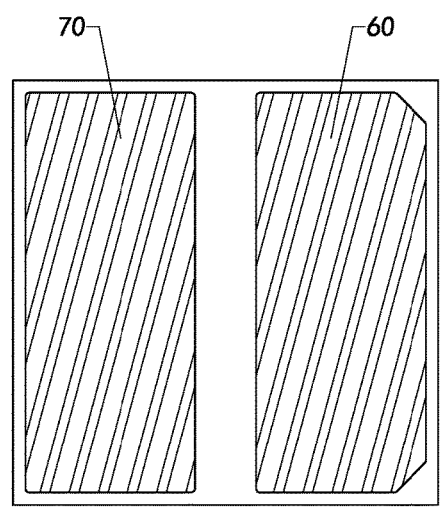
FIG. 13B is a top view illustrating the step seven of the manufacturing method of the flip-chip according to the above preferred embodiment of the present invention.

As shown in FIGS. 13A and 13B, the at least one N-type electrode 60A and the at least one P-type electrode 70A, which are independent of each other, are respectively formed in different areas of the outer side surface 93A of the at least one insulating layer 90A, wherein the at least one N-type electrode 60A is extended to and electrically connected with the at least one N current spreading layer 40A via the one or more first channels 91A of the at least one insulating layer 90A. And correspondingly, the at least one P-type electrode 70A is extended to and electrically connected with the at least one P current spreading layer 80A via the one or more second channels 92A of the at least one insulating layer 90A.

Specifically, in a specific embodiment of the flip-chip of the present invention, the at least one N-type electrode 60A and the at least one P-type electrode 70A can be formed by performing negative photoresist lithography and lift-off on the outer side surface 93A of the at least one insulating layer 90A. More specifically, a pattern of electrodes to be deposited can be photolithographically patterned on the outer side surface 93A of the at least one insulating layer 90A using a negative photoresist, and then the at least one N-type electrode 60A and the at least one P-type electrode 70A are etched using evaporated or sputtered coating on the pattern. The at least one N-type electrode 60A is extended to and electrically connected with the at least one N current spreading layer 40A via the one or more first channels 91A of the at least one insulating layer 90A. Correspondingly, the at least one P-type electrode 70A is extended to and is electrically connected with the at least one P current spreading layer 80A via the one or more second channels 91A of the at least one insulating layer 90A. After a pattern of electrodes to be deposited is formed on the outer side surface of the at least one insulating layer 90A using a negative photoresist, and the at least one N-type electrode 60A and the at least one P-type electrode 70A are deposited on the lithographically patterned pattern of electrodes by evaporated or sputtered coating, a flip-chip semi-finished product 100A can be further processed. For example, an excess metal layer is firstly stripped off, and then the remaining photoresist on the surface of the flip-chip semi-finished product 100A is removed. In the flip-chip of the present invention, the method of stripping off the excess metal layer of the flip-chip semi-finished product 100A is not limited. For example, the remaining photoresist on the surface of flip-chip semi-finished product 100A can be stripped off by blue film technology, so as to obtain the flip-chip.

Preferably, the structures of the at least one N-type electrode 60A and the at least one P-type electrode 70A are chromium (Cr), aluminum (Al), titanium (Ti), platinum (Pt), gold (Au), nickel (Ni), gold tin (AuSn) electrode structure. In other words, the materials of the electrode structure of the at least one N-type electrode 60A and the at least one P-type electrode 70A are selected from the group consisting of chromium (Cr), aluminum (Al), titanium (Ti), platinum (Pt), gold (Au), tin (Sn), nickel (Ni), and gold tin (AuSn). Specifically, two or more materials of the electrode structure of the at least one N-type electrode 60A and the at least one P-type electrode 70A can be selected from a material group consisting of chromium (Cr), aluminum (Al), titanium (Ti), platinum (Pt), gold (Au), and tin. (Sn), nickel (Ni), gold tin (AuSn), or that one kind of material may be selected from chromium (Cr), aluminum (Al), titanium (Ti), platinum (Pt), gold (Au), tin (Sn), nickel (Ni), and gold tin (AuSn). The thickness of the at least one N-type electrode 60A and the thickness of the at least one P-type electrode 70A range from 0 μm to 7 μm (including 7 μm).

In other words, as shown in FIGS. 13A and 13B, a specific structure of the flip-chip according to the another preferred embodiment of the present invention is illustrated, wherein the flip-chip comprises the epitaxial unit 10A, the at least one reflective layer 20A, the at least one anti-diffusion layer 30A, the at least one N current spreading layer 40A, the at least one P current spreading layer 80A, the at least one distributed Bragg reflector 50A, the at least one N-type electrode 60A, and the at least one P-type electrode 70A. The substrate 11A, the N-type layer 12A, the active layer 13A, and the P-type layer 14A of the epitaxial unit 10A are sequentially stacked. The at least one N-type layer exposed portion 15A of the epitaxial unit 10A is extended from the outer side surface 141A of the P-type layer 14A to the N-type layer 12A via the active layer 13A, such that at least a portion of the area of the N-type layer 12A is exposed. The at least one reflective layer 20A is formed on the outer side surface 141A of the P-type layer 14A of the epitaxial unit 10A, and the at least one anti-diffusion layer 30A is formed on the outer side surface 141A of the P-type layer 14A of the epitaxial unit 10A. The at least one anti-diffusion layer 30A fully covers the at least one reflective layer 20A. The at least one distributed Bragg reflector 50A integrally combines the N-type layer 12A, the active layer 13A, the P-type layer 14A, and the at least one anti-diffusion layer 30A. And, at least a part of the N-type layer 12A is formed corresponding to the one or more N-type layer channels 51A of the at least one distributed Bragg reflector 50A. At least a part of the P-type layer 14A is formed corresponding to the one or more P-type layer channels 52A of the at least one distributed Bragg reflector 50A. The at least one N current spreading layer 40A is formed in the at least one distributed Bragg reflector 50A, and the at least one N current spreading layer 40A is extended to and electrically connected with the N-type layer 12A via the one or more N-type layer channels 51A of the at least one distributed Bragg reflector 50A. Accordingly, the at least one P current spreading layer 80A is formed in the at least one distributed Bragg reflector 50A, and the at least one P current spreading layer 80A is extended to and electrically connected with the P-type layer 14A via the one or more P-type layer channels 52A of the at least one distributed Bragg reflector 50A. The at least one N current spreading layer 40A and the at least one P current spreading layer 80A have a safe distance therebetween. The at least one insulating layer 90A is integrally coupled to the at least one distributed Bragg reflector 50A, the at least one N current spreading layer 40A, and the at least one P current spreading layer 80A, wherein the at least one N current spreading layer 40A is formed corresponding to the one or more first channels 91A of the at least one insulating layer 90A, and the at least one P current spreading layer 80A is formed corresponding to the one or more second channels 92A of the at least one insulating layer 90A. The at least one insulating layer 90A further isolates the at least one N current spreading layer 40A and the at least one P current spreading layer 80A. The at least one N-type electrode 60A is formed on the at least one insulating layer 90A. The at least one N-type electrode 60A is extended to and electrically connected with the at least one N current spreading layer 40A via the first via 91A of the at least one insulating layer 90A. The at least one P-type electrode 70A is formed on the at least one insulating layer 90A, and the at least one P-type electrode 70A is extended to and electrically connected with the at least one P current spreading layer 80A via the second via 92A of the at least one insulating layer 90A. The at least one N-type electrode 60A and the at least one P-type electrode 70A are independent of each other.

When the at least one N-type electrode 60A and the at least one P-type electrode 70A are applied with an operating voltage, the active layer 13A of the epitaxial unit 10A is capable of generating light and radiating to the outside, wherein the light generated from the active layer 13A radiated toward the substrate 11A of the epitaxial unit 10A can be directly radiated to the outside via the substrate 11A. And, the light generated by the active layer 13A in the direction of the at least one reflective layer 20A can be irradiated by the at least one reflective layer 20A to the outside via the substrate 11A, and that at the same time, the light generated by the active layer 13A in the direction of the at least one distributed Bragg reflector 50A can be reflected by the at least one distributed Bragg reflector 50A to the outside via the substrate 11A. In such a manner, the reflectivity of the flip-chip can be greatly improved, so that the overall luminance of the light emitting diode can be improved, which is unexpected in the prior art.

It is worth mentioning that the thicknesses of the substrate 11A, the N-type layer 12A, the active layer 13A, the P-type layer 14A, the at least one reflective layer 20A, the at least one anti-diffusion layer 30A, the at least one N current spreading layer 40A, the at least one distributed Bragg reflector 50A, the at least one N-type electrode 60A, the at least one P-type electrode 70A, and the at least one P current spreading layer 80A and the at least one insulating layer 90A of the flip-chip as shown in FIGS. 7 to 13B of the present invention are merely for illustration purpose as example, but not intending to represent the actual real thicknesses of the substrate 11A, the N-type layer 12A, the active layer 13A, the P-type layer 14A, the at least one reflective layer 20A, the at least one anti-diffusion layer 30A, the at least one N current spreading layer 40A, the at least one distributed Bragg reflector 50A, the at least one N-type electrode 60A, the at least one P-type electrode 70A and the at least one P current spreading layer 80A and the at least one insulating layer 90A. Moreover, person skilled in the art should realize that the real dimensional proportion of the substrate 11A, the N-type layer 12A, the active layer 13A, the P-type layer 14A, the at least one reflective layer 20A, the at least one anti-diffusion layer 30A, the at least one N current spreading layer 40A, the at least one distributed Bragg reflector 50A, the at least one N-type electrode 60A, the at least one P-type electrode 70A, and the at least one P current spreading layer 80A and the at least one insulating layer 90A are not exactly in proportional dimension as shown in the drawings. Moreover, the real dimensional proportion of the at least one N-type electrode 60A and the at least one P-type electrode 70A and the real proportion between the at least one N-type electrode 60A the at least one P-type electrode 70A and other layers of the flip-chip are not exactly in proportional dimension as shown in the drawings.

According to another aspect of the present invention, the present invention further provides a manufacturing method of a flip-chip of light emitting diode, wherein the manufacturing method comprises the following steps:

(a) forming at least one reflective layer 20 on the outer side surface 141 of a P-type layer 14 of the epitaxial unit 10;

(b) covering an area of the outer side surface 141 of the P-type layer 14 that is not covered by the at least one reflective layer by at least one distributed Bragg reflector 50; and (c) electrically connecting a P-type electrode 70 to the P-type layer 14, and electrically connecting an N-type electrode 60 to an N-type layer 12 of the epitaxial unit 10 to produce the flip-chip.

According to another aspect of the present invention, the present invention further provides an illuminating method of a flip-chip of a light emitting diode, wherein the illuminating method comprises the following steps:

(A) applying an operating voltage to an N-type electrode 60 and a P-type electrode 70 of the flip-chip to cause an active layer 13 of the flip-chip to generate light;

(B) allowing the light generated by the active layer 13 to be radiated toward a substrate 11 of the flip-chip to radiate to the outside of the flip-chip after passing through the substrate 11;

(C) reflecting light generated by the active layer 13 in the direction of a P-type layer 14 of the flip-chip by one or more reflective layer 20, such that the reflected light passes through the substrate 11 to the outside of the flip-chip; and (D) reflecting light generated by the active layer 13 in the direction of the P-type layer 14 by at least one distributed Bragg reflector 50, such that the reflected light passes through the substrate 11 to the outside of the flip-chip.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention comprises all modifications encompassed within the spirit and scope of the following claims.

What is claimed is:

1. A flip-chip of light emitting diode, comprising:
at least one reflective layer;
at least one N-type electrode;
at least one P-type electrode;
at least one distributed Bragg reflector;
an epitaxial unit, wherein the epitaxial unit comprises a substrate, an N-type layer, an active layer, and a P-type layer, wherein the substrate, the N-type layer, the active layer, and the P-type are sequentially stacked, and that the epitaxial unit has at least one N-type layer exposed portion, wherein the at least one N-type layer exposed portion is extended from an outer side surface of the P-type layer to the N-type layer via the active layer, wherein the at least one reflective layer is formed on the P-type layer, wherein the at least one distributed Bragg reflector is integrally bonded to the N-type layer, the active layer, the P-type layer, and the at least one reflective layer, wherein the at least one N-type electrode is electrically connected with the N-type layer and the at least one P-type electrode is electrically connected with the P-type layer;

at least one anti-diffusion layer formed on the outer side surface of the P-type layer, wherein the at least one anti-diffusion layer covers at least a portion of the at least one reflective layer, and the at least one distributed Bragg reflector is integrally combined with the at least one anti-diffusion layer, and at least one N current spreading layer and at least one P current spreading layer, wherein the at least one distributed Bragg reflector has one or more N-type layer channels and one or more P-type layer channels, wherein the N-type layer is formed corresponding to the one or more N-type layer channels, wherein the at least one N current spreading layer is formed in the at least one distributed Bragg reflector, and the at least one N current spreading layer is extended through the one or more N-type layer channels to the N-type layer, and the at least one N current spreading layer is electrically connected with the N-type layer, wherein the at least one N-type electrode is electrically connected with the N-type layer in such a manner that the at least one N-type electrode is electrically connected with the N-current spreading layer, wherein the P-type layer is formed corresponding to the one or more P-type layer channels, wherein the at least one P current spreading layer is formed on the at least one distributed Bragg reflector, and the at least one P current spreading layer is extended via the one or more P-type layer channels to the P-type layer, and the at least one P current spreading layer is electrically connected with the P-type layer, wherein the at least one P-type electrode is electrically connected with the P-type layer in such a manner that the at least one P-type electrode is electrically connected with the at least one P current spreading layer;

wherein the at least one anti-diffusion layer is electrically connected with the P-type layer, and the at least one P-type electrode is electrically connected with the P-type layer in such a manner that the at least one P-type electrode is electrically connected with the at least one anti-diffusion layer.

2. The flip-chip, as recited in claim 1, wherein the least one N current spreading layer is electrically connected with the N-type layer in such a manner that the at least one N current spreading layer is remained on N-type layer exposed portion, wherein the at least one N-type electrode is electrically connected with the N-type layer in such a manner that the at least one N-type electrode is electrically connected with the at least one N current spreading layer, wherein the at least one distributed Bragg reflector is integrally combined with the at least one N current spreading layer.

3. The flip-chip, as recited in claim 2, wherein the at least one distributed Bragg reflector has one or more N-type layer channels and one or more P-type layer channels, wherein the at least one N current spreading layer is formed corresponding to the one or more N-type layer channels, wherein the at least one N-type electrode is formed on the at least one distributed Bragg reflector, and the at least one N-type electrode is extended to the at least one N current spreading layer via the one or more N-type layer channels, wherein the at least one anti-diffusion layer is formed corresponding to the one or more P-type layer channels, wherein the at least one P-type electrode is formed on the at least one distributed Bragg reflector, and the at least one P-type electrode is extended to the at least one anti-diffusion layer via the one or more P-type layer channels.

4. The flip-chip, as recited in claim 1, further comprising at least one insulating layer, wherein the at least one insulating layer has one or more first channels, And one or more second channels, wherein the at least one insulating layer is formed on the at least one N current spreading layer and the at least one P current spreading layer, and the one or more first channels is formed corresponding to the at least one N current spreading layer, and the one or more second channels is formed corresponding to the at least one P current spreading layer, wherein the at least one N-type electrode is electrically connected with the at least one N current spreading layer through the one or more first channels of the at least one insulating layer, wherein the at least one P-type electrode is electrically connected with the at least one P current spreading layer through the one or more second channels of the at least one insulating layer, wherein the at least one insulating layer is combined with the at least one distributed Bragg reflector, so as to isolate the at least one N current spreading layer and the at least one P current spreading layer by the at least one insulating layer.

5. The flip-chip, as recited in claim 4, wherein the N-type electrode is formed on the at least one insulating layer, and the at least one N-type electrode is extended to the at least one N current spreading layer via the one or more first channels of the at least one insulating layer, wherein the at least one P-type electrode is formed on the at least one insulating layer, and the at least one P-type electrode is extended to the at least one P current spreading layer via the one or more second channels of the at least one insulating layer.

6. The flip-chip, as recited in claim 5, wherein a material of the film layer of the at least one distributed Bragg reflector is selected from the group consisting of silicon oxide, titanium oxide, magnesium fluoride, cerium oxide, aluminum oxide, and aluminum nitride, wherein a material of the at least one anti-diffusion layer is selected from the group consisting of titanium tungsten, titanium, platinum, aluminum, nickel, and gold, wherein a material of the at least one N current spreading layer is selected from the group consisting of chromium, aluminum, titanium, platinum, gold, and nickel, wherein a material of the at least one P current spreading layer is selected from the group consisting of chromium, aluminum, titanium, platinum, gold, and nickel, wherein an electrode material of the at least one N-type electrode and the at least one P-type electrode is selected from the group consisting of chromium, aluminum, titanium, platinum, gold, nickel, and gold tin, wherein the N-type layer is an N-type gallium nitride layer and the P-type layer is a P-type gallium nitride layer, wherein a material of the at least one insulating layer is selected from the group consisting of silicon oxide, silicon nitride, silicon oxynitride, aluminum oxide, and aluminum nitride, wherein a structure of the at least one reflective layer is a stacked structure of silver and titanium tungsten.

7. A manufacturing method for a flip-chip of light emitting diode, comprising:
  (a) forming at least one reflective layer on an outer side surface of a P-type layer of an epitaxial unit;
  (b) covering an area of the outer side surface of the P-type layer that is not covered by the at least one reflective layer by at least one distributed Bragg reflector; and
  (c) electrically connecting a P-type electrode to the P-type layer, and electrically connecting an N-type electrode to an N-type layer of the epitaxial unit to produce the flip-chip,
  wherein the manufacturing method further comprises forming an anti-diffusion layer on the outer side surface of the P-type layer, wherein the at least one reflective layer is covered by the at least one anti-diffusion layer, and the at least one anti-diffusion layer is electrically connected with the P-type layer, such that in the step (c), the at least one P-type electrode is electrically connected with the P-type layer in such a manner that the at least one P-type electrode is electrically connected with the at least one anti-diffusion layer,
  wherein the flip-chip further comprising at least one N current spreading layer and at least one P current spreading layer, wherein the at least one distributed Bragg reflector has one or more N-type layer channels and one or more P-type layer channels, wherein the N-type layer is formed corresponding to the one or more N-type layer channels, wherein the at least one N current spreading layer is formed in the at least one distributed Bragg reflector, and the at least one N current spreading layer is extended through the one or more N-type layer channels to the N-type layer, and the at least one N current spreading layer is electrically connected with the N-type layer, wherein the at least one N-type electrode is electrically connected with the N-type layer in such a manner that the at least one N-type electrode is electrically connected with the N-current spreading layer, wherein the P-type layer is formed corresponding to the one or more P-type layer channels, wherein the at least one P current spreading layer is formed on the at least one distributed Bragg reflector, and the at least one P current spreading layer is extended via the one or more P-type layer channels to the P-type layer, and the at least one P current spreading layer is electrically connected with the P-type layer, wherein the at least one P-type electrode is electrically connected with the P-type layer in such a manner that the at least one P-type electrode is electrically connected with the at least one P current spreading layer.

8. The manufacturing method, as recited in claim 7, before the step (b), further comprising a step of forming at least one N current spreading layer on the N-type layer, wherein the at least one N current spreading layer is electrically connected with the N-type layer, such that in the step (c), the at least one N-type electrode is electrically connected with the N-type layer in such a manner that the at least one N-type electrode is electrically connected with the at least one N current spreading layer.

9. The manufacturing method, as recited in claim 8, wherein in the step (b), in a manner that the at least one distributed Bragg reflector is integrally coupled to the P-type layer, the at least one anti-diffusion layer and the at least one N current spreading layer, the at least one distributed Bragg reflector covers an area of the outer side of the P-type layer that is not covered by the at least one reflective layer, wherein the at least one distributed Bragg reflector has one or more N-type layer channels corresponding to the at least one N current spreading layer and one or more P-type layer channels corresponding to the at least one anti-diffusion layer, wherein the at least one N-type electrode is electrically connected with the N-current spreading layer via the one or more N-type layer channels, wherein the at least one P-type electrode is electrically connected with the at least one anti-diffusion layer via the one or more P-type layer channels.

10. The manufacturing method, as recited in claim 9, wherein the at least one N-type electrode is formed on the at least one distributed Bragg reflector, such that the at least one N-type electrode is extended to the N current extension via the one or more N-type layer channels, wherein the at least one P-type electrode is formed on the at least one distributed Bragg reflector, such that the at least one P-type electrode is extended to the at least one anti-diffusion layer via the one or more P-type layer channels.

11. The manufacturing method, as recited in claim 7, wherein in the step (b), in a manner that the at least one distributed Bragg reflector is integrally formed on the P-type layer, the at least one anti-diffusion layer and the at least one N current spreading layer, the at least one distributed Bragg reflector covers an area of the outer side of the P-type layer that is not covered by the at least one reflective layer, wherein the at least one distributed Bragg reflector has one or more N-type layer channels corresponding to the N-type layer and one or more P-type layer channels corresponding to the P-type layer, wherein the at least one N-type electrode is electrically connected with the N-type layer via the one or more N-type layer channels, wherein the at least one P-type electrode is electrically connected with the P-type layer via the one or more P-type layer channels.

12. The manufacturing method, as recited in claim 11, further comprising the steps of:
(i) forming at least one N current spreading layer on the at least one distributed Bragg reflector, wherein the at least one N current spreading layer is extended to the N-type layer via the one or more N-type layer channels, wherein the at least one N current spreading layer is electrically connected with the N-type layer, wherein the at least one N-type electrode is electrically connected with the at least one N current spreading layer; and
(ii) forming at least one P current spreading layer on the at least one distributed Bragg reflector, wherein the at least one P current spreading layer is extended to the P-type layer via the one or more P-type layer channels, wherein the at least one P current spreading layer is electrically connected with the P-type layer, wherein the at least one P-type electrode is electrically connected with the at least one P current spreading layer.

13. The manufacturing method, as recited in claim 12, further comprising a step of forming at least one insulating layer on the at least one N current spreading layer, the at least one P current spreading layer and the at least one distributed Bragg reflector, wherein the at least one insulating layer has one or more first channels corresponding to the at least one N current spreading layer and one or more second channels corresponding to the at least one P current spreading layer, wherein the at least one N-type electrode is electrically connected with the at least one N current spreading layer via the one or more first channels, wherein the at least one P-type electrode is electrically connected with the at least one P current spreading layer via the one or more second channels.

14. The manufacturing method, as recited in claim 12, wherein the at least one N-type electrode is formed on the at least one insulating layer, such that the at least one N-type electrode is extended to the at least one N current spreading layer via the one or more first channels, wherein the at least one P-type electrode is formed on the at least one insulating layer, such that the at least one P-type electrode is extended to the at least one P current spreading layer via the one or more second channels.

15. An illuminating method of a flip-chip of light emitting diode, comprising:
(A) applying operating voltage to an N-type electrode and a P-type electrode of the flip-chip to cause an active layer of the flip-chip to generate light;
(B) allowing light generated by the active layer toward a substrate of the flip-chip to emit to the outside of the flip-chip after passing through the substrate;
(C) reflecting light from the active layer toward a P-type layer of the flip-chip by the at least one reflective layer, such that the reflected light passes through the substrate to radiate towards the outside of the flip-chip; and
(D) reflecting light from the active layer toward the P-type layer by the at least one distributed Bragg reflector, such that the reflected light passes through the substrate to radiate towards the outside of the flip-chip,
wherein an anti-diffusion layer is formed on an outer side surface of the P-type layer, wherein the at least one reflective layer is covered by the at least one anti-diffusion layer, and the at least one anti-diffusion layer is electrically connected with the P-type layer, such that the at least one P-type electrode is electrically connected with the P-type layer in such a manner that the at least one P-type electrode is electrically connected with the at least one anti-diffusion layer,
wherein the flip-chip further comprising at least one N current spreading layer and at least one P current spreading layer, wherein the at least one distributed Bragg reflector has one or more N-type layer channels and one or more P-type layer channels, wherein the N-type layer is formed corresponding to the one or more N-type layer channels, wherein the at least one N current spreading layer is formed in the at least one distributed Bragg reflector, and the at least one N current spreading layer is extended through the one or more N-type layer channels to the N-type layer, and the at least one N current spreading layer is electrically connected with the N-type layer, wherein the at least one N-type electrode is electrically connected with the N-type layer in such a manner that the at least one N-type electrode is electrically connected with the N-current spreading layer, wherein the P-type layer is formed corresponding to the one or more P-type layer channels, wherein the at least one P current spreading layer is formed on the at least one distributed Bragg reflector, and the at least one P current spreading layer is extended via the one or more P-type layer channels to the P-type layer, and the at least one P current spreading layer is electrically connected with the P-type layer, wherein the at least one P-type electrode is electrically connected with the P-type layer in such a manner that the at least one P-type electrode is electrically connected with the at least one P current spreading layer.

16. The illuminating method, as recited in claim 15, wherein the at least one reflective layer covers a partial area of an outer side of the P-type layer, wherein the at least one distributed Bragg reflector covers another partial area of an outer side of the P-type layer, thereby in the step (C) and the step (D), both the at least one reflective layer and the at least one distributed Bragg reflector are capable of reflecting light generated by the active layer toward the P-type layer.

* * * * *